(12) United States Patent
Tsukamoto et al.

(10) Patent No.: US 11,069,407 B2
(45) Date of Patent: Jul. 20, 2021

(54) SEMICONDUCTOR MEMORY DEVICE

(71) Applicant: KIOXIA CORPORATION, Tokyo (JP)

(72) Inventors: Takayuki Tsukamoto, Yokkaichi Mie (JP); Hironobu Furuhashi, Kuwana Mie (JP); Takeshi Sugimoto, Yokohama Kanagawa (JP); Masanori Komura, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,850

(22) Filed: Mar. 3, 2020

(65) Prior Publication Data

US 2021/0074355 A1 Mar. 11, 2021

(30) Foreign Application Priority Data

Sep. 5, 2019 (JP) .............................. JP2019-161833

(51) Int. Cl.
| | | |
|---|---|---|
| *G11C 11/00* | (2006.01) | |
| *G11C 13/00* | (2006.01) | |
| *H01L 27/24* | (2006.01) | |
| *H01L 45/00* | (2006.01) | |

(52) U.S. Cl.
CPC ........ *G11C 13/0069* (2013.01); *G11C 13/004* (2013.01); *G11C 13/0004* (2013.01); *G11C 13/0097* (2013.01); *H01L 27/2481* (2013.01); *H01L 45/06* (2013.01); *H01L 45/1233* (2013.01); *H01L 45/144* (2013.01); *G11C 2013/005* (2013.01); *G11C 2013/0092* (2013.01); *G11C 2213/51* (2013.01); *G11C 2213/52* (2013.01); *G11C 2213/71* (2013.01); *H01L 45/1253* (2013.01)

(58) Field of Classification Search
CPC .......... G11C 13/004; G11C 2013/0045; G11C 13/0004; G11C 13/0069; H01L 27/2481; H01L 45/1233
See application file for complete search history.

(56) References Cited

U.S. PATENT DOCUMENTS

| | | | |
|---|---|---|---|
| 6,106,903 A | 8/2000 | Upadhya | |
| 8,593,853 B2 | 11/2013 | Katoh | |
| 8,787,070 B2 | 7/2014 | Shimakawa | |
| 9,484,090 B2 | 11/2016 | Yoshimoto et al. | |

(Continued)

FOREIGN PATENT DOCUMENTS

JP 2011-018838 A 1/2011

*Primary Examiner* — Toan K Le
(74) *Attorney, Agent, or Firm* — Foley & Lardner LLP

(57) ABSTRACT

A semiconductor memory device includes: first wirings; second wirings intersecting the first wirings; and memory cells. Each of the memory cells is respectively formed between one of the first wirings and one of the second wirings. In a set operation, a set pulse is supplied between one of the first wirings and one of the second wirings. In a reset operation, a reset pulse is supplied between one of the first wirings and one of the second wirings. In a first operation, a first pulse is supplied between one of the first wirings and one of the second wirings. the first pulse has an amplitude equal to or greater than the greater of an amplitude of the set pulse and an amplitude of the reset pulse and has a pulse width greater than a pulse width of the set pulse.

10 Claims, 16 Drawing Sheets

(56) References Cited

U.S. PATENT DOCUMENTS

| | | | |
|---|---|---|---|
| 2009/0296458 A1* | 12/2009 | Lee | G11C 13/0004 |
| | | | 365/163 |
| 2013/0329485 A1* | 12/2013 | Takashima | G11C 13/0011 |
| | | | 365/148 |
| 2013/0336048 A1 | 12/2013 | Hokenmaier | |
| 2014/0301129 A1* | 10/2014 | Kawai | G11C 13/0069 |
| | | | 365/148 |
| 2016/0155502 A1* | 6/2016 | Goux | H01L 45/1233 |
| | | | 365/148 |
| 2017/0358350 A1* | 12/2017 | Kim | G11C 13/004 |
| 2019/0156909 A1* | 5/2019 | Lee | G11C 29/72 |
| 2020/0111836 A1* | 4/2020 | Tomita | H01L 45/04 |
| 2020/0227476 A1* | 7/2020 | Tomita | G11C 13/0007 |

* cited by examiner

SEMICONDUCTOR MEMORY DEVICE

CROSS-REFERENCE TO RELATED APPLICATION(S)

This application is based upon and claims the benefit of priority from Japanese Patent Application No. 2019-161833, filed Sep. 5, 2019, the entire contents of which are incorporated herein by reference.

FIELD

Embodiments described herein relate generally to a semiconductor memory device.

BACKGROUND

A known semiconductor memory device includes a plurality of first wirings, a plurality of second wirings intersecting the plurality of first wirings, and a plurality of memory cells that are formed between the plurality of first wirings and the plurality of second wirings, and each include a variable resistance layer and a nonlinear element layer including chalcogen.

Examples of related art include JP-A-2011-018838.

DETAILED DESCRIPTION

Figure 1:
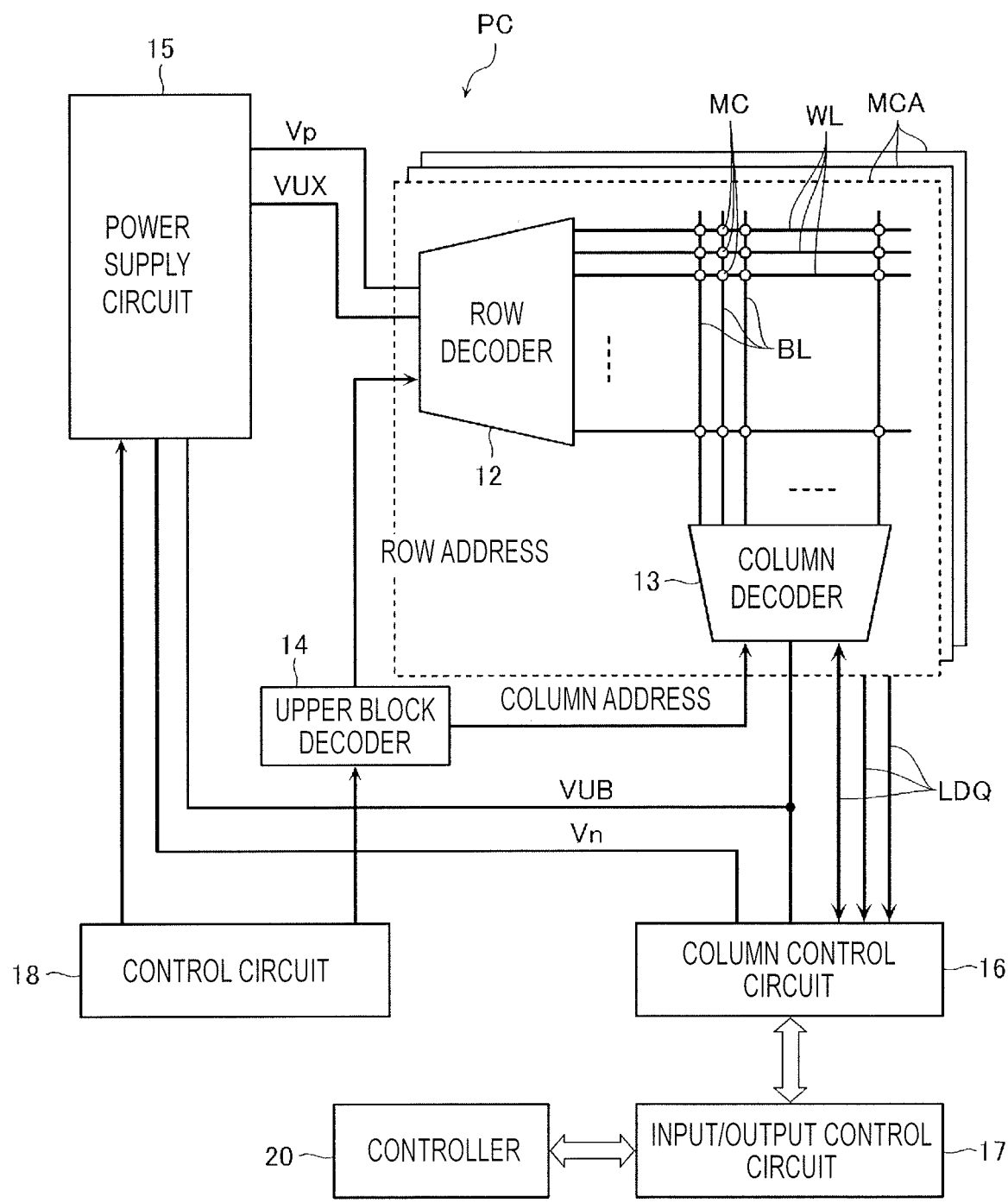
FIG. 1 is a schematic functional block diagram illustrating a configuration of a portion of a semiconductor memory device according to a first embodiment.

Embodiments provide an appropriately controllable semiconductor memory device.

In general, according to one embodiment, a semiconductor memory device includes: a plurality of first wirings; a plurality of second wirings intersecting the plurality of first wirings; and a plurality of memory cells. Each of the plurality of memory cells is respectively formed between one of the plurality of first wirings and one of the plurality of second wirings, and includes a variable resistance layer and a nonlinear element layer including chalcogen. The memory device is configured such that in a set operation, a set pulse is supplied between one of the plurality of first wirings and one of the plurality of second wirings. In a reset operation, a reset pulse is supplied between one of the plurality of first wirings and one of the plurality of second wirings. In a first operation, a first pulse is supplied between one of the plurality of first wirings and one of the plurality of second wirings. the first pulse has an amplitude equal to or greater than the greater of an amplitude of the set pulse and an amplitude of the reset pulse and has a pulse width greater than a pulse width of the set pulse.

According to another embodiment, a semiconductor memory device includes: a plurality of first wirings; a plurality of second wirings intersecting the plurality of first wirings; and a memory chip including a plurality of memory cells that are formed between the plurality of first wirings and the plurality of second wirings, and each include a variable resistance layer and a nonlinear element layer including chalcogen. A first sequence including a first operation and a second operation is executed according to an input of a first command set including address data. In the first operation, a temperature of the memory chip increases, and in the second operation, a first pulse is supplied between one of the plurality of first wirings and one of the plurality of second wirings.

Hereinafter, a semiconductor memory device according to embodiments will be described in detail with reference to the accompanying drawings. In addition, the embodiments are merely examples and are not intended to limit the present disclosure.

In addition, in the descriptions herein, a predetermined direction parallel to the surface of a substrate will be referred to as an X direction, a direction parallel to the surface of the substrate and perpendicular to the X direction will be referred to as a Y direction, and a direction perpendicular to the surface of the substrate will be referred to as a Z direction.

In addition, in the descriptions herein, a direction along a predetermined plane may be referred to as a first direction, a direction crossing the first direction along the predetermined plane may be referred to as a second direction, and a direction crossing the predetermined plane may be referred to as a third direction. The first, second, and third directions may or may not correspond to the X, Y, and Z directions.

In addition, in the descriptions herein, expressions such as "upward (upper)" or "downward (lower)" are defined based on a substrate. For example, when the first direction crosses the surface of the substrate, a direction away from the substrate along the first direction will be referred to as an upward(upper) direction, and a direction approaching the substrate along the first direction will be referred to as a downward(lower) direction. In addition, a "lower surface" or "lower end" of a certain component indicates the surface or end of the component close to the substrate, and an "upper surface" or "upper end" of a certain component indicates the surface or end of the component opposite to the substrate. Furthermore, a surface that crosses the second direction or the third direction will be referred to as a side surface or the like.

In addition, in the descriptions herein, a "semiconductor memory device" may refer to, for example, a memory chip or a memory die, a configuration including a controller chip or a controller die in addition to the memory chip or the memory die, or a device or the like on which the configuration is mounted.

Hereinafter, a circuit configuration of a semiconductor memory device according to embodiments will be described with reference to the drawings. In addition, the following drawings are schematic, and may omit a portion of configuration for the convenience of description.

First Embodiment

[Circuit Configuration]

Figure 2:
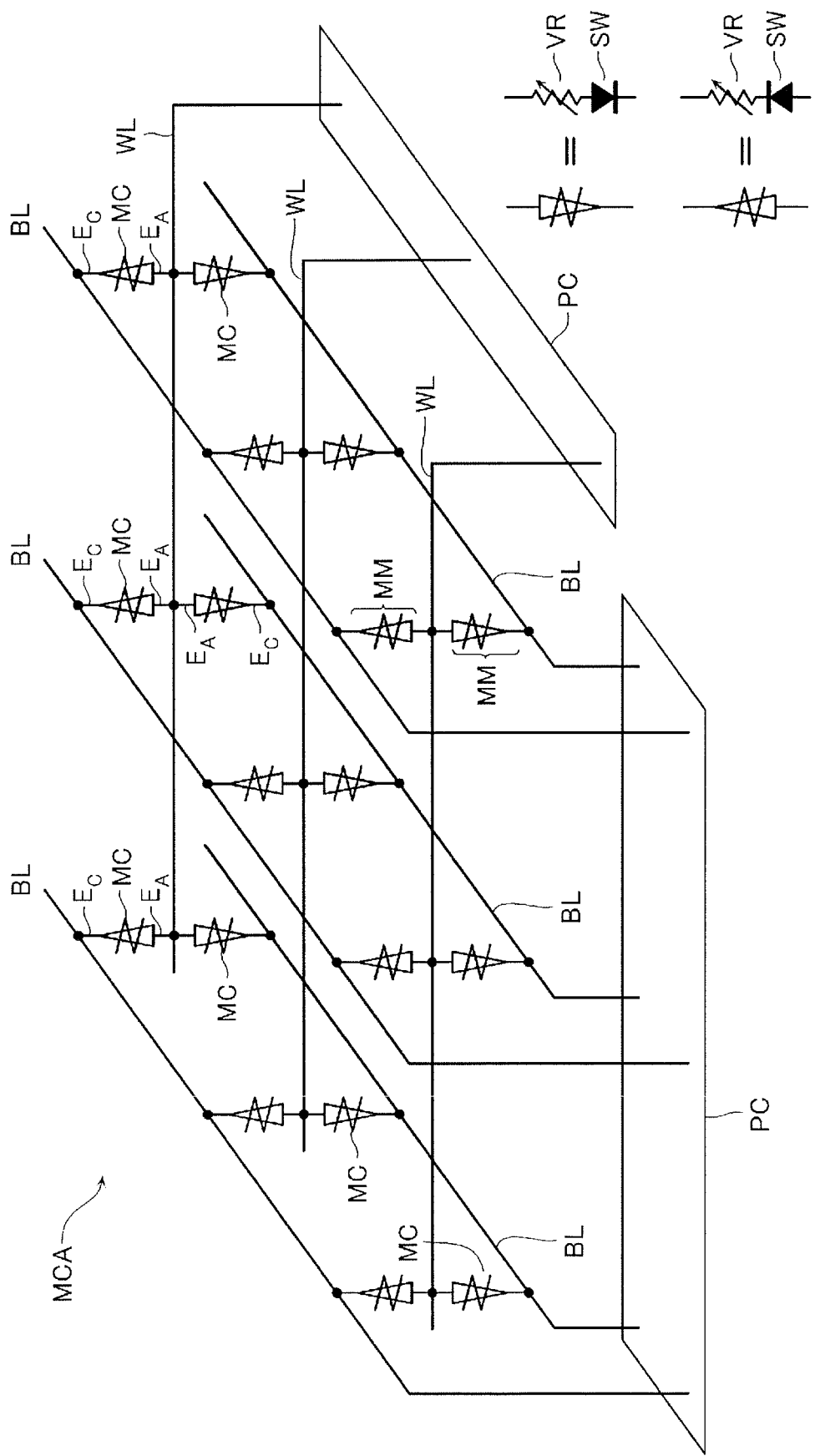
FIG. 2 is a schematic circuit diagram illustrating a configuration of a portion of the same semiconductor memory device.
Figure 3:
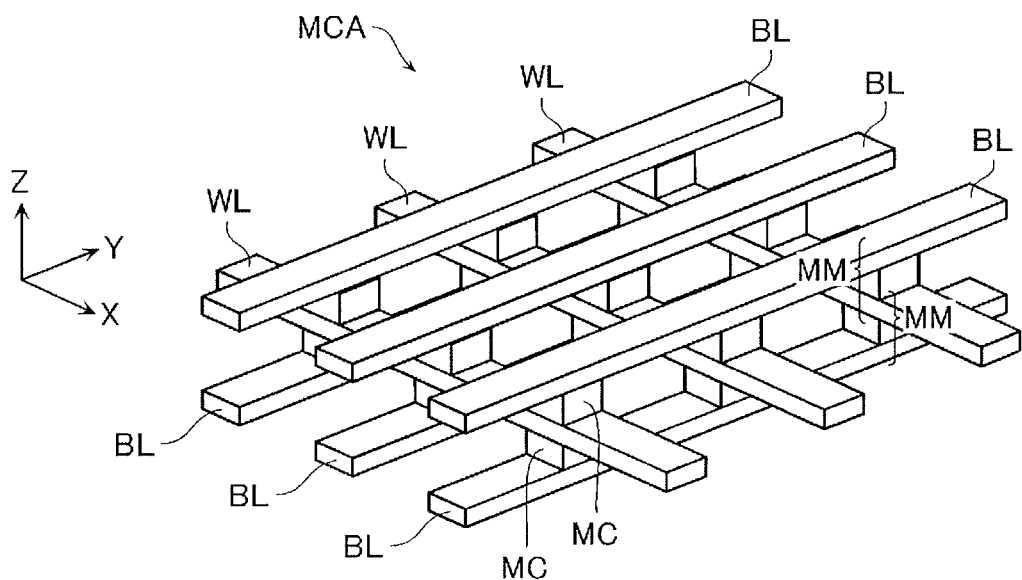
FIG. 3 is a schematic perspective view illustrating the configuration of the same semiconductor memory device.

First, a circuit configuration of a semiconductor memory device according to a first embodiment will be described with reference to FIGS. 1 to 3. FIG. 1 is a schematic block diagram illustrating a configuration of a portion of the same semiconductor memory device. FIG. 2 is a schematic circuit diagram illustrating a configuration of a portion of the same semiconductor memory device. FIG. 3 is a schematic perspective view illustrating a configuration of a portion of the same semiconductor memory device.

As illustrated in FIG. 1, the semiconductor memory device according to the present embodiment includes a plurality of memory cell array MCA, a peripheral circuit PC that controls the plurality of memory cell arrays MCA, and a controller 20 that controls the memory cell arrays MCA through the peripheral circuit PC.

Each memory cell array MCA includes a plurality of memory mats MM arranged in the Z direction, for example, as illustrated in FIG. 3. Each memory mat MM includes a plurality of bit lines BL arranged in the X direction and extending in the Y direction, a plurality of word lines WL arranged in the Y direction and extending in the X direction, and a plurality of memory cells MC arranged in the X direction and the Y direction corresponding to the bit lines BL and the word lines WL. In the example illustrated in FIG. 3, two memory mats MM arranged in the Z direction share the word lines WL.

In the example of FIG. 2, a cathode $E_C$ of a memory cell MC is connected to a bit line BL, and an anode $E_A$ of a memory cell MC is connected to a word line WL. Each memory cell MC includes a variable resistance element VR and a nonlinear element NO.

For example, as illustrated in FIG. 1, the peripheral circuit PC includes a plurality of row decoders 12 (voltage transfer circuits) and a plurality of column decoders 13 (voltage transfer circuits) which are formed corresponding to the plurality of memory cell arrays MCA. Further, the peripheral circuit PC includes an upper block decoder 14 that supplies a row address and a column address to a row decoder 12 and a column decoder 13, respectively, a power supply circuit (voltage output circuit) 15 that outputs voltages to be supplied to the bit lines BL and the word lines WL, a column control circuit 16 connected to the column decoders 13, an input/output control circuit 17 connected to the column control circuit 16, and a control circuit 18 that controls the upper block decoder 14, the power supply circuit 15, the column control circuit 16, and the input/output control circuit 17.

Each row decoder 12 includes, for example, a plurality of transfer transistors connected between the plurality of word lines WL and a plurality of voltage supply lines Vp and VUX. The row decoder 12 makes a selected word line WL corresponding to a supplied row address conductive with the voltage supply line Vp, and makes the other unselected word lines WL conductive with the voltage supply line VUX.

The column decoder 13 includes, for example, a plurality of transfer transistors connected between the plurality of bit lines BL and a plurality of voltage supply lines Vn and VUB. The column decoder 13 makes a selected bit line BL corresponding to a supplied column address conductive with a wiring LDQ, and makes the other unselected bit lines BL conductive with the voltage supply line VUB.

The power supply circuit 15 includes, for example, a plurality of step-down circuits, such as regulators or the like, corresponding to the plurality of voltage supply lines Vp, VUX, Vn, and VUB. The power supply circuit 15 adjusts voltages of the plurality of voltage supply lines Vp, VUX, Vn, and VUB, by appropriately stepping down a power supply voltage according to a control signal from the control circuit 18.

The column control circuit 16 includes, for example, a sense amplifier circuit and a voltage transfer circuit which are connected to wirings LDQ, and a data buffer circuit. The sense amplifier circuit detects a magnitude relationship between a voltage or current of a wiring LDQ and a predetermined threshold value according to a control signal from the control circuit 18, and outputs the detection result as data of "0" or "1" to the data buffer circuit. According to a control signal from the control circuit 18, the voltage transfer circuit makes a wiring LDQ corresponding to the bit of "0" in the data buffer circuit conductive with the voltage supply line Vn, and makes a wiring LDQ corresponding to the bit of "1" conductive with the voltage supply line VUB. In addition, the relationship between the bit of "0" and the bit of "1" may be reversed.

The input/output control circuit 17 outputs data received from the data buffer circuit in the column control circuit 16, to the controller 20. Further, the input/output control circuit 17 outputs data received from the controller 20 to the data buffer circuit in the column control circuit 16.

The controller 20 includes, for example, a processor, a RAM, a ROM, an ECC circuit, etc., and performs processes such as conversion between a logical address and a physical address, bit error detection/correction, wear leveling, etc.

[Example of Configuration]

Next, an example of the configuration of the semiconductor memory device according to the present embodiment will be described in more detail with reference to FIGS. 4 to 9A and 9B.

Figure 4:
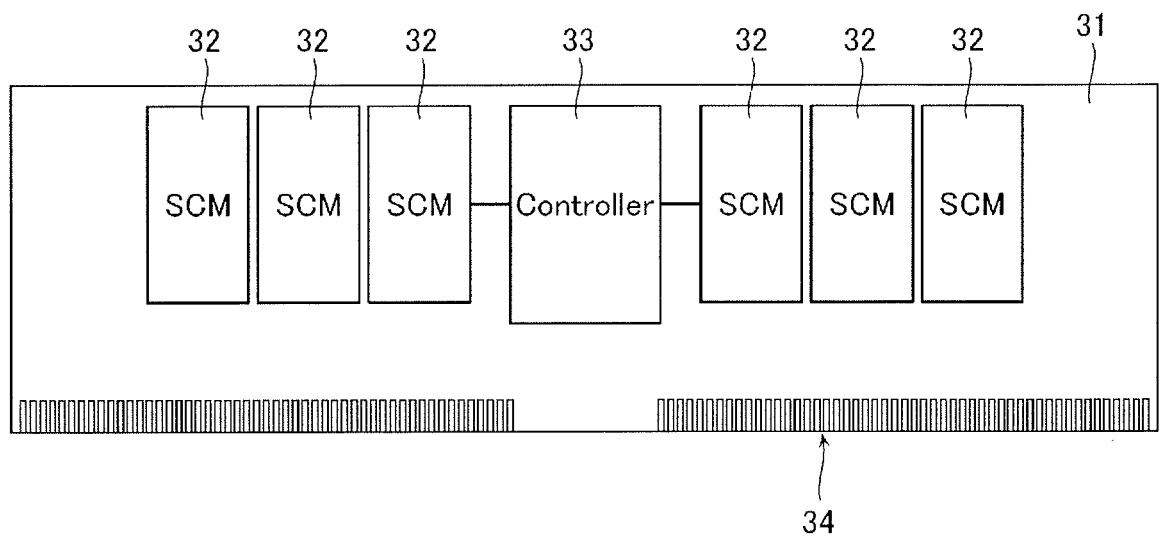
FIG. 4 is a schematic plan view illustrating the configuration of the same semiconductor memory device.

FIG. 4 is a schematic plan view illustrating an example of a configuration of a memory system according to the present embodiment. The memory system according to the present embodiment includes a mounting substrate 31, a plurality of memory chips 32 mounted on the mounting substrate 31, and a controller chip 33 mounted on the mounting substrate 31. Each of the plurality of memory chips 32 includes the plurality of memory cell arrays MCA and the peripheral circuit PC described with reference to FIG. 1 and so on. Each of the plurality of memory chips 32 is connected to the controller chip 33 via printed wirings or the like formed on the mounting substrate 31. The controller chip 33 corresponds to the controller 20 described with reference to FIG. 1. The controller chip 33 is connected to a host computer or the like via a printed wiring formed on the mounting substrate 31, and a terminal 34 or the like formed at the end of the mounting substrate 31.

Figure 5:
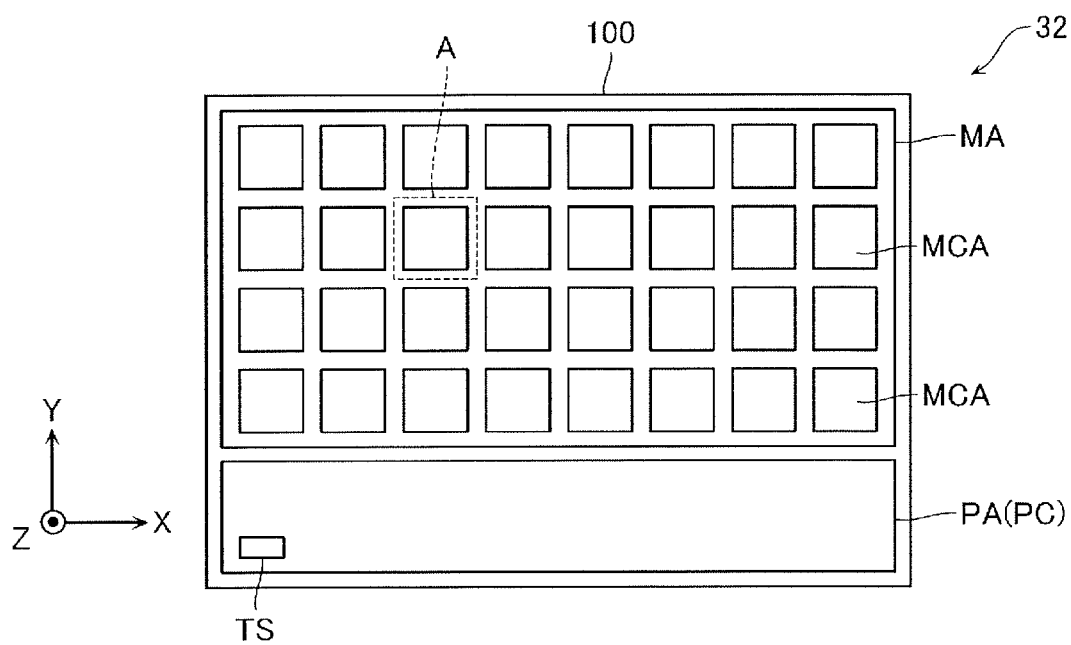
FIG. 5 is a schematic plan view illustrating a configuration of a portion of the same semiconductor memory device.

FIG. 5 is a schematic plan view illustrating an example of a configuration of the memory chip 32. The memory chip 32 includes a substrate 100. A memory area MA and a peripheral area PA are formed in the substrate 100. A plurality of memory cell arrays MCA are formed in the memory area MA to be arranged in the form of a matrix in the X and Y directions. A portion of the peripheral circuit PC is formed in the peripheral area PA. Further, a temperature sensor TS is provided in the peripheral area PA of the memory chip 32 according to the present embodiment.

Figure 6:
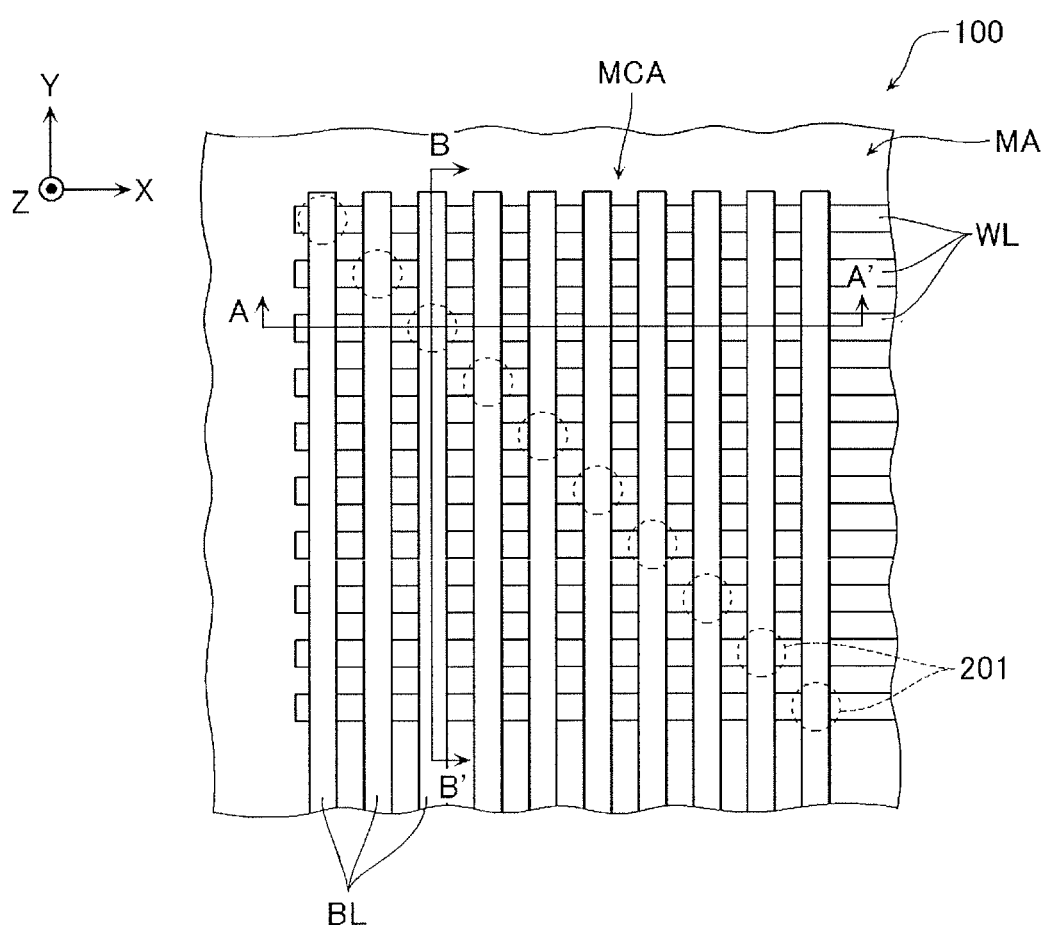
FIG. 6 is a schematic enlarged view illustrating a portion A in FIG. 5.
Figure 7:
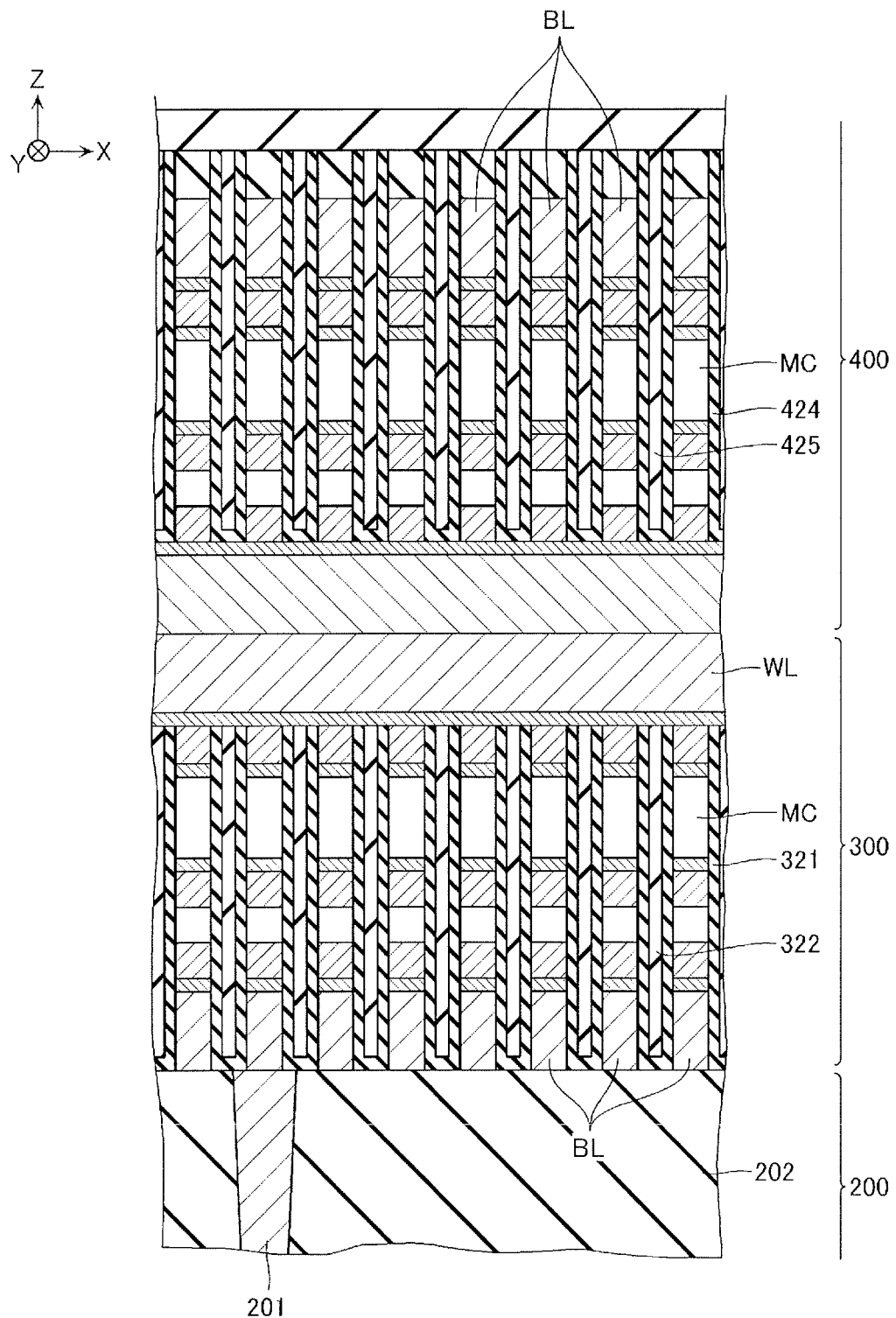
FIG. 7 is a schematic cross-sectional view of the structure illustrated in FIG. 6, which is taken along line A-A' and viewed in the arrow direction.
Figure 8:
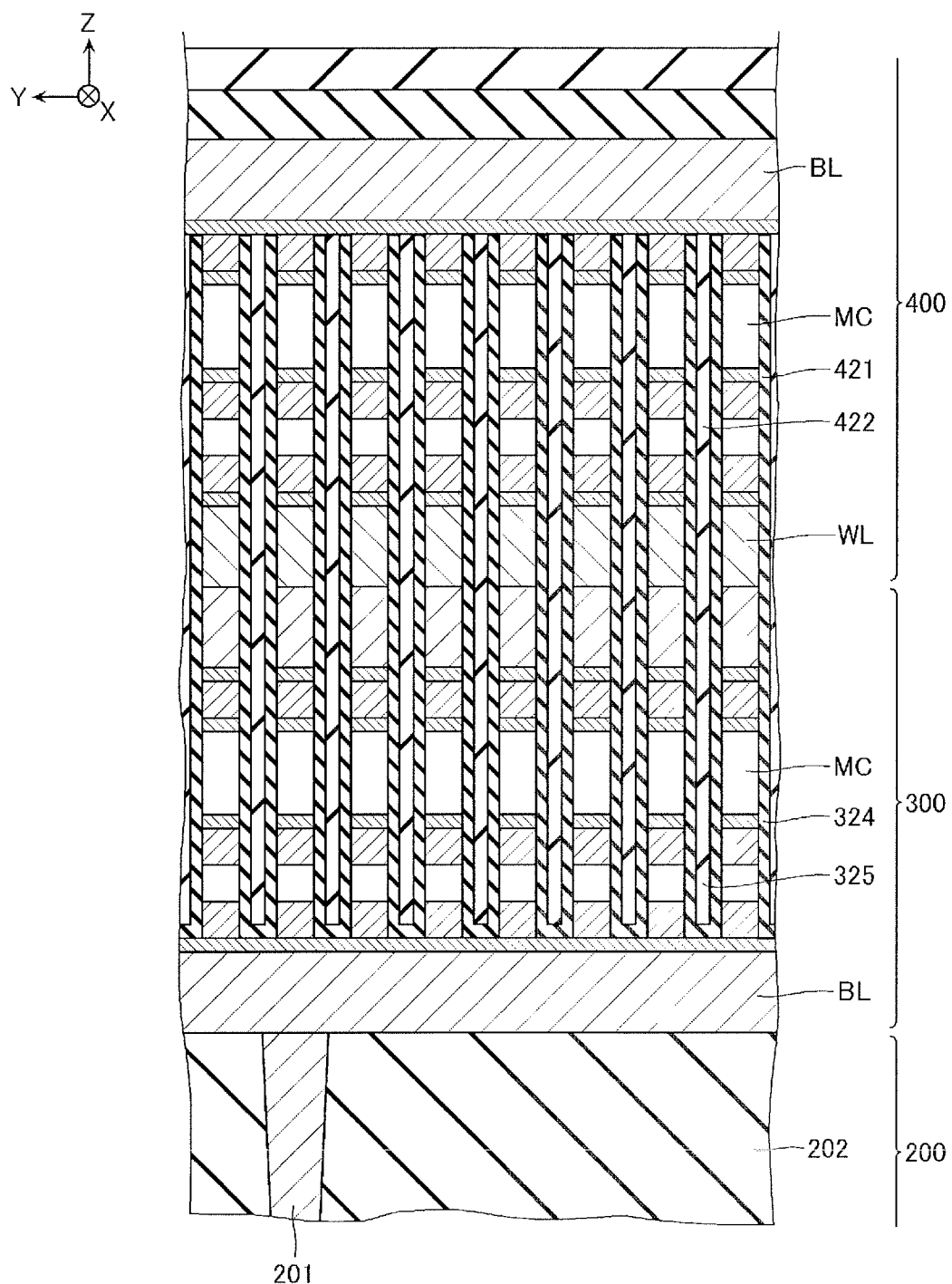
FIG. 8 is a schematic cross-sectional view of the structure illustrated in FIG. 6, which is taken along line B-B' and viewed in the arrow direction.
Figure 9A:
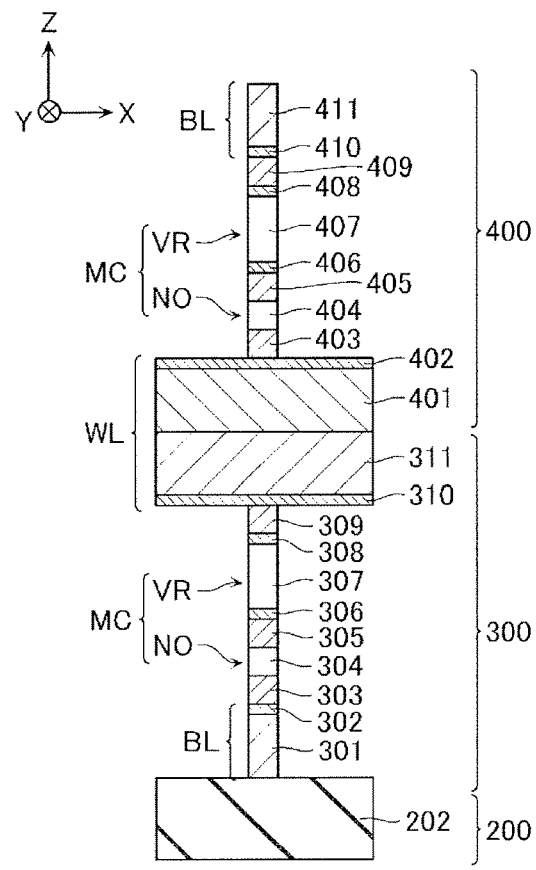
FIGS. 9A and 9B are schematic cross-sectional views corresponding to portions of FIGS. 7 and 8.
Figure 9B:
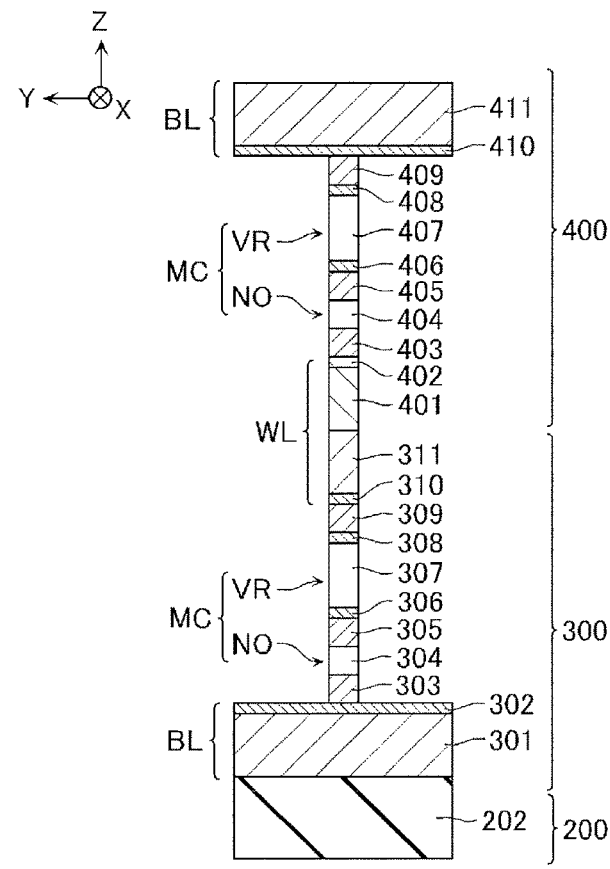

FIG. 6 is a schematic enlarged view illustrating a portion A in FIG. 5. FIG. 7 is a schematic cross-sectional view of the structure illustrated in FIG. 6, which is taken along line A-A' and viewed in the arrow direction. FIG. 8 is a schematic cross-sectional view of the structure illustrated in FIG. 6, which is taken along line B-B' and viewed in the arrow direction. FIGS. 9A and 9B are schematic cross-sectional views corresponding to portions of FIGS. 7 and 8.

As illustrated in FIG. 7, the semiconductor memory device according to the present embodiment includes a wiring layer 200, a memory layer 300 formed on the wiring layer 200, and a memory layer 400 formed on the memory layer 300.

The wiring layer 200 includes contact wirings 201 (FIG. 7) and insulating layers 202 (FIG. 7) each formed between the contact wirings 201.

Each contact wiring 201 extends in the Z direction and functions as a contact connected to a bit line BL. The contact wiring 201 includes, for example, a stacked film of titanium nitride (TiN) and tungsten (W), or the like.

Each insulating layer 202 includes, for example, silicon oxide ($SiO_2$) or the like.

For example, as illustrated in FIGS. 9A and 9B, the memory layer 300 includes a conductive layer 301, a barrier conductive layer 302, an electrode layer 303, a chalcogen layer 304, an electrode layer 305, a barrier conductive layer 306, a chalcogen layer 307, a barrier conductive layer 308, an electrode layer 309, a barrier conductive layer 310, and a conductive layer 311.

The conductive layer 301 is formed on the upper surface of the insulating layer 202. The conductive layer 301 extends in the Y direction and functions as a portion of a bit line BL. The conductive layer 301 includes, for example, tungsten (W) or the like.

The barrier conductive layer 302 is formed on the upper surface of the conductive layer 301. The barrier conductive layer 302 extends in the Y direction and functions as a portion of a bit line BL. The barrier conductive layer 302 includes, for example, tungsten nitride (WN) or the like.

The electrode layer 303 is formed on the upper surface of the barrier conductive layer 302. The electrode layer 303 functions as a cathode $E_c$ of a memory cell MC. The electrode layer 303 includes, for example, carbon nitride (CN) or the like.

The chalcogen layer 304 is formed on the upper surface of the electrode layer 303. The chalcogen layer 304 functions as a nonlinear element NO. For example, when a voltage lower than a predetermined threshold value is applied to the chalcogen layer 304, the chalcogen layer 304 is in a high resistance state. When the voltage applied to the chalcogen layer 304 reaches the predetermined threshold value, the chalcogen layer 304 becomes a low resistance state, and a current flowing in the chalcogen layer 304 increases by several orders of magnitude. When the voltage applied to the chalcogen layer 304 falls below a predetermined voltage for a certain time, the chalcogen layer 304 becomes the high resistance state again.

The chalcogen layer 304 includes, for example, at least one type of chalcogen. The chalcogen layer 304 may include, for example, chalcogenide which is a compound containing chalcogen. In addition, the chalcogen layer 304 may include at least one type of element selected from a group consisting of B, Al, Ga, In, C, Si, Ge, Sn, As, P, and Sb.

In addition, the chalcogen referred to herein indicates an element, except for oxygen (O), among elements that belong to Group 16 of the periodic table. The chalcogen includes, for example, sulfur (S), selenium (Se), tellurium (Te) or the like.

The electrode layer 305 is formed on the upper surface of the chalcogen layer 304. The electrode layer 305 functions as an electrode connected to a variable resistance element VR and a nonlinear element NO. The electrode layer 305 includes, for example, carbon (C) or the like.

The barrier conductive layer 306 is formed on the upper surface of the electrode layer 305. The barrier conductive layer 306 includes, for example, tungsten nitride (WN) or the like.

The chalcogen layer 307 is formed on the upper surface of the barrier conductive layer 306. The chalcogen layer 307 functions as a variable resistance element VR. The chalcogen layer 307 includes, for example, a crystal region and a phase change region. The phase change region is formed closer to the cathode side than the crystal region. The phase change region becomes an amorphous state (reset state: high resistance state) by a heating to a melting temperature or higher and a rapid cooling. In addition, the phase change region becomes a crystalline state (set state: low resistance state) by an overheating to a temperature lower than the melting temperature and higher than a crystallization temperature, and a gentle cooling.

The chalcogen layer 307 includes, for example, at least one type of chalcogen. The layer 307 may include, for example, chalcogenide which is a compound containing chalcogen. The chalcogen layer 307 may be, for example, GeSbTe, GeTe, SbTe, SiTe or the like. In addition, the chalcogen layer 307 may include at least one type of element selected from germanium (Ge), antimony (Sb), and tellurium (Te).

The barrier conductive layer 308 is formed on the upper surface of the chalcogen layer 307. The barrier conductive layer 308 includes, for example, tungsten nitride (WN) or the like.

The electrode layer 309 is formed on the upper surface of the barrier conductive layer 308. The electrode layer 309 functions as an anode $E_A$ of a memory cell MC. The electrode layer 309 includes, for example, carbon (C) or the like.

The barrier conductive layer 310 is formed on the upper surface of the electrode layer 309. The barrier conductive layer 310 extends in the X direction and functions as a portion of a word line WL. The barrier conductive layer 310 includes, for example, tungsten nitride (WN) or the like.

The conductive layer 311 is formed on the upper surface of the barrier conductive layer 310. The conductive layer 311 extends in the X direction and functions as a portion of a word line WL. The conductive layer 311 includes, for example, tungsten (W) or the like.

In addition, for example, as illustrated in FIG. 7, barrier insulating layers 321, and insulating layers 322 each formed between the barrier insulating layers 321 are formed on the side of configuration of the memory layer 300 in the X direction. Each barrier insulating layer 321 includes silicon nitride (SiN) or the like. Each insulating layer 322 includes, for example, silicon oxide ($SiO_2$) or the like.

In addition, for example, as illustrated in FIG. 8, barrier insulating layers 324 and insulating layers 325 each formed between the barrier insulating layers 324 are formed on the side of the configuration of the memory layer 300 in the Y direction. Each barrier insulating layer 324 includes silicon nitride (SiN) or the like. Each insulating layer 325 includes, for example, silicon oxide ($SiO_2$) or the like.

For example, as illustrated in FIGS. 9A and 9B, the memory layer 400 includes a conductive layer 401, a barrier conductive layer 402, an electrode layer 403, a chalcogen layer 404, an electrode layer 405, a barrier conductive layer 406, a chalcogen layer 407, a barrier conductive layer 408, an electrode layer 409, a barrier conductive layer 410, and a conductive layer 411.

The conductive layer 401 is formed on the upper surface of the conductive layer 311. The conductive layer 401 extends in the X direction and functions as a portion of a word line WL. The conductive layer 401 includes, for example, tungsten (W) or the like.

The barrier conductive layer 402 is formed on the upper surface of the conductive layer 401. The barrier conductive layer 402 extends in the X direction and functions as a portion of a word line WL. The barrier conductive layer 402 includes, for example, tungsten nitride (WN) or the like.

The electrode layer 403 is formed on the upper surface of the barrier conductive layer 402. The electrode layer 403 functions as an anode $E_A$ of a memory cell MC. The electrode layer 403 includes, for example, carbon nitride (CN) or the like.

The chalcogen layer 404 is formed on the upper surface of the electrode layer 403. The chalcogen layer 404 functions as a nonlinear element NO, like the chalcogen layer 304. The chalcogen layer 404 includes, for example, the same material as that of the chalcogen layer 304.

The electrode layer 405 is formed on the upper surface of the chalcogen layer 404. The electrode layer 405 functions as an electrode connected to a variable resistance element VR and a nonlinear element NO. The electrode layer 405 includes, for example, carbon (C) or the like.

The barrier conductive layer 406 is formed on the upper surface of the electrode layer 405. The barrier conductive layer 406 includes, for example, tungsten nitride (WN) or the like.

The chalcogen layer 407 is formed on the upper surface of the barrier conductive layer 406. The chalcogen layer 407 functions as a variable resistance element VR, like the chalcogen layer 307. The chalcogen layer 407 includes, for example, the same material as that of the chalcogen layer 307.

The barrier conductive layer 408 is formed on the upper surface of the chalcogen layer 407. The barrier conductive layer 408 includes, for example, tungsten nitride (WN) or the like.

The electrode layer 409 is formed on the upper surface of the barrier conductive layer 408. The electrode layer 409 functions as a cathode $E_c$ of a memory cell MC. The electrode layer 409 includes, for example, carbon (C) or the like.

The barrier conductive layer 410 is formed on the upper surface of the electrode layer 409. The barrier conductive layer 410 extends in the Y direction and functions as a portion of a bit line BL. The barrier conductive layer 410 includes, for example, tungsten nitride (WN) or the like.

The conductive layer 411 is formed on the upper surface of the barrier conductive layer 410. The conductive layer 411 extends in the Y direction and functions as a portion of a bit line BL. The conductive layer 411 includes, for example, tungsten (W) or the like.

In addition, for example, as illustrated in FIG. 8, barrier insulating layers 421 and insulating layers 422 each formed between the barrier insulating layers 421 are formed on the side of the configuration of the memory layer 400 in the Y direction. Each barrier insulating layer 421 includes silicon nitride (SiN) or the like. Each insulating layer 422 includes, for example, silicon oxide ($SiO_2$) or the like.

In addition, for example, as illustrated in FIG. 7, barrier insulating layers 424 and insulating layers 425 each formed between the barrier insulating layers 424 are formed on the side of the configuration of the memory layer 400 in the X direction. Each barrier insulating layer 424 includes silicon nitride (SiN) or the like. Each insulating layer 425 includes, for example, silicon oxide ($SiO_2$) or the like.

Figure 10:
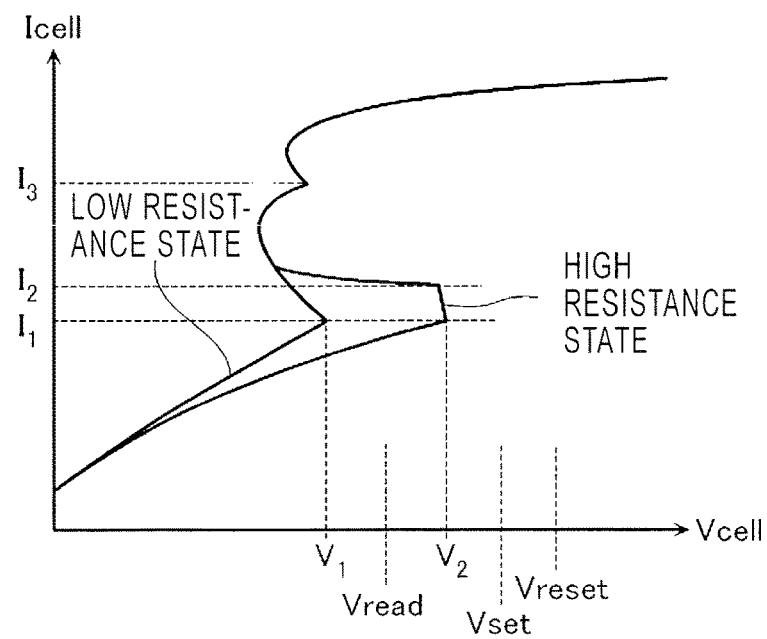
FIG. 10 is a schematic graph illustrating current-voltage characteristics of a memory cell MC of the same semiconductor memory device.

FIG. 10 is a schematic graph illustrating the current-voltage characteristic of a memory cell MC according to the present embodiment. The horizontal axis represents a cell voltage Vcell which is a voltage of an anode $E_A$ with respect to a cathode $E_C$ of a memory cell MC. The vertical axis represents a cell current Icell flowing in a memory cell MC as a logarithmic axis.

In a range where the cell current Icell is smaller than a predetermined current value $I_1$, the cell voltage Vcell increases monotonously as the cell current Icell increases. At a time point when the cell current Icell reaches the current value $I_1$, the cell voltage Vcell of a memory cell MC in the low resistance state reaches a voltage $V_1$. In addition, the cell voltage Vcell of a memory cell MC in the high resistance, state reaches a voltage $V_2$. The voltage $V_2$ is larger than the voltage $V_1$.

In a range where the cell current Icell is larger than the current value $I_1$ and smaller than a current value $I_2$, the cell voltage Vcell decreases monotonously as the cell current Icell increases. In this range, the cell voltage Vcell of the memory cell MC in the high resistance state is larger than the cell voltage Vcell of the memory cell MC in the low resistance state.

In a range where the cell current Icell is larger than the current value $I_2$ and smaller than a current value $I_3$, the cell voltage Vcell temporarily decreases and then increases as the cell current Icell increases. In this range, as the cell current Icell increases, the cell voltage Vcell of the memory cell MC in the high resistance state sharply decreases and becomes substantially equal to the cell voltage Vcell of the memory cell MC in the low resistance state.

In a range where the cell current Icell is larger than the current value $I_3$, the cell voltage Vcell temporarily decreases and then increases as the cell current Icell increases.

In this state, when the cell current Icell is made rapidly decreased to a value smaller than the current value $I_1$, the chalcogen layers 307 and 407 become the high resistance state. In addition, when the cell current Icell is maintained at a current between the current value $I_2$ and the current value $I_3$ for a certain time or longer, and then, is made decreased to a value smaller than the current value $I_1$, the chalcogen layers 307 and 407 become the low resistance state.

[Operation]

Next, a read operation and a write operation of the semiconductor memory device according to the present embodiment will be described with reference to FIGS. 11 to 14. In addition, as the write operation, a set operation and a reset operation will be described.

Figure 11:
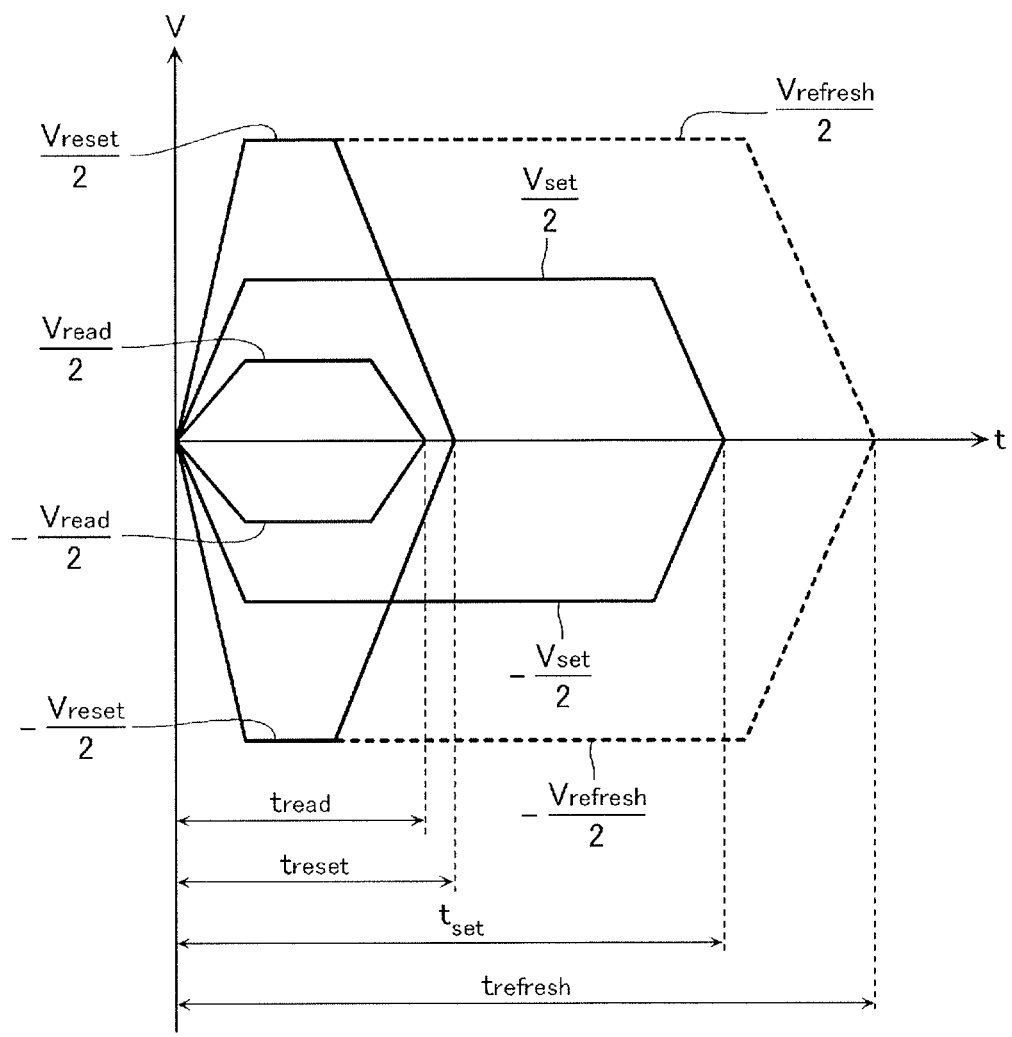
FIG. 11 is a schematic graph illustrating voltages of a selected bit line BL and a selected word line WL in a read operation, a write operation and others.

FIG. 11 is a schematic graph illustrating voltages of a selected bit line BL and a selected word line WL in the read operation, the write operation and others. The vertical axis represents the voltages of the selected bit line BL and the selected word line WL, and the horizontal axis represents time.

[Read Operation]

Figure 12:
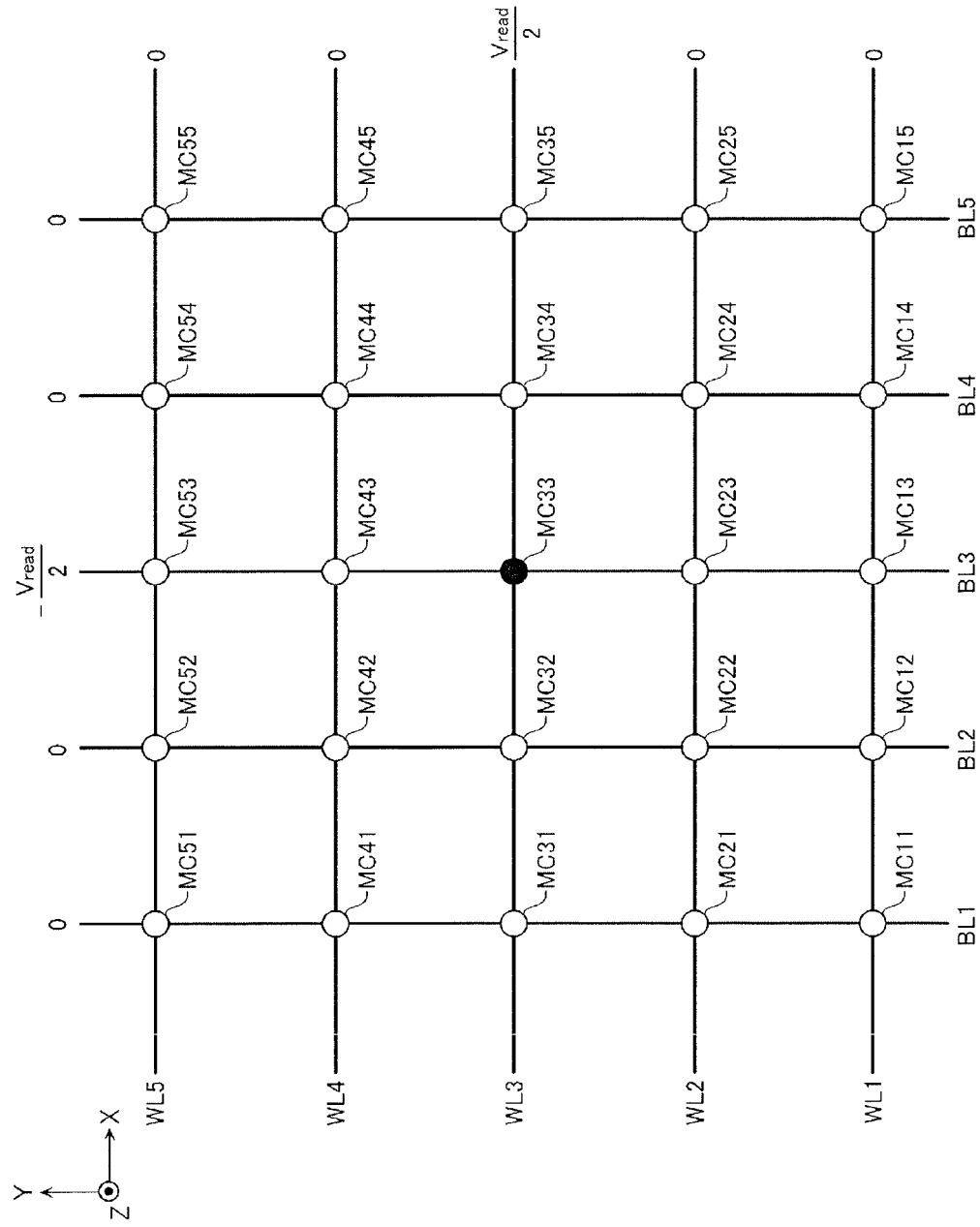
FIG. 12 is a schematic view illustrating voltages supplied to bit lines BL and word lines WL in a read operation.

FIG. 12 is a schematic view illustrating voltages supplied to bit lines BL and word lines WL in the read operation. In addition, in FIG. 12 and so on, bit line BL1 to BL5 are illustrated as examples of a plurality of bit lines BL arranged in the X direction. Further, word lines WL1 to WL5 are, illustrated as examples of a plurality of word lines WL arranged in the Y direction. Further, memory cells MC11 to MC55 are illustrated as examples of a plurality of memory cells MC connected to the bit line BL1 to BL5 and the word line WL1 to WL5. In the following description, for example, a case where a memory cell MC33 is a selected memory cell MC will be described.

In the read operation, for example, a plurality of memory mats MM arranged in the X direction are selected from the plurality of memory mats MM formed on the substrate 100 (see FIG. 5), and the following operation is executed for the plurality of memory mats MM. That is, a voltage $-V_{read}/2$ is transferred to a selected bit line BL3. For example, the select bit line BL3 is brought into conduction with the voltage supply line Vn, and the voltage of the voltage supply line Vn is set to the voltage $-V_{read}/2$. In addition, a voltage 0V is transferred to unselected bit lines BL1, BL2, BL4, and BL5. For example, the unselected bit lines BL1, BL2, BL4, and BL5 are brought into conduction with the voltage supply line VUB, and the voltage of the voltage supply line VUB is set to the voltage 0V. In addition, a voltage $V_{read}/2$ is transferred to a selected word line WL3. For example, the selected word line WL3 is brought into conduction with the voltage supply line Vp, and the voltage of the voltage supply line Vp is set to the voltage $V_{read}/2$. In addition, a voltage 0V is transferred to unselected word lines WL1, WL2, WL4, and WL5. For example, the unselected word lines WL1, WL2, WL4, and WL5 are brought into conduction with the voltage supply line VUX, and the voltage of the voltage supply line VUX is set to the voltage 0V.

As illustrated in FIG. 11, a read pulse having an amplitude $V_{read}$ and a pulse width $t_{read}$ is supplied to the selected memory cell MC. When the selected memory cell MC33 is in the set state (low resistance state: crystalline state), a current flows in the selected memory cell MC33. Meanwhile, when the selected memory cell MC33 is in the reset state (high resistance state: amorphous state), a current hardly flows in the selected memory cell MC33.

In addition, in the read operation, for example, data is read bit by bit from the plurality of selected memory mats MM. That is, the sense amplifier circuit in the column control circuit 16 detects the magnitude relationship between the voltage or current of the selected bit line BL3 and a predetermined threshold value, and outputs the detection result as data of "0" or "1" to the data buffer circuit. In addition, the data in the data buffer circuit is output to the controller 20 through the input/output control circuit 17. The controller 20 performs error detection/correction or the like on the received data and outputs the result of the error detection/correction or the like to a host computer or the like.

In addition, in the read operation, the voltage $V_{read}/2$ is supplied to unselected memory cells MC13, MC23, MC43, MC53, MC31, MC32, MC34, and MC35 connected to the selected bit line BL3 or the selected word line WL3 (hereinafter, referred to as "semi-selected memory cells"). However, since the voltage $V_{read}/2$ is set to be smaller than the voltage $V_1$ in FIG. 10, a current hardly flows in the semi-selected memory cells MC13, MC23, MC43, MC53, MC31, MC32, MC34, and MC35.

[Set Operation]

Figure 13:
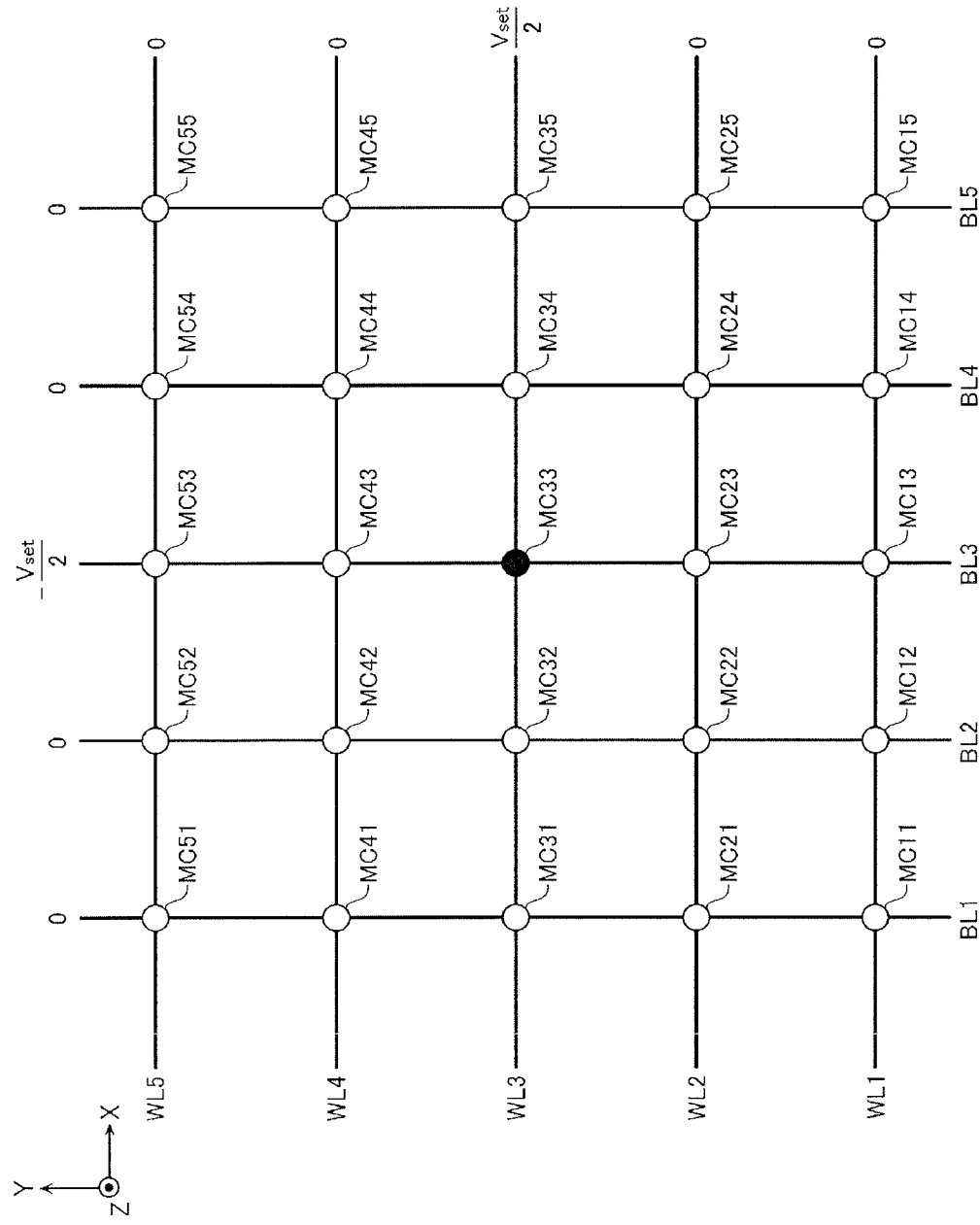
FIG. 13 is a schematic view illustrating voltages supplied to bit lines BL and word lines WL in a set operation.

FIG. 13 is a schematic view illustrating voltages supplied to bit lines BL and word lines WL in the set operation.

In the set operation, for example, a plurality of memory mats MM arranged in the X direction are selected from the plurality of memory mats MM formed on the substrate 100 (see FIG. 5), and the following operation is executed for the plurality of selected memory mats MM. That is, a voltage $-V_{set}/2$ is transferred to a selected bit line BL3 corresponding to the bit of "0" (or the bit of "1") in the data buffer circuit, and a voltage 0V is transferred to the other selected bit lines BL3. In addition, a voltage 0V is transferred to the unselected bit lines BL1, BL2, BL4, and BL5. In addition, a voltage $V_{set}/2$ is transferred to the selected word line WL3. In addition, a voltage 0V is transferred to the unselected word lines WL1, WL2, WL4, and WL5.

As illustrated in FIG. 11, a set pulse (write pulse) having an amplitude $V_{set}$ and a pulse width $t_{set}$ is supplied to the selected memory cell MC. The amplitude $V_{set}$ is larger than the amplitude $V_{read}$. In addition, the pulse width $t_{set}$ is larger than the pulse width tread. As a result, a current flows in the memory cell MC so that Joule heat is generated, and the chalcogen layer 307 or 407 is heated. Accordingly, when the selected memory cell MC33 is in the reset state, the amorphous portion in the chalcogen layer 307 or 407 in the selected memory cell MC33 is crystallized, and the selected memory cell MC33 becomes the set state.

In addition, in the set operation, a voltage $V_{set}/2$ is supplied to the semi-selected memory cells MC13, MC23, MC43, MC53, MC31, MC32, MC34, and MC35. However, since the voltage $V_{set}/2$ is set to be smaller than the voltage $V_1$ in FIG. 10, a current hardly flows in the semi-selected memory cells MC13, MC23, MC43, MC53, MC31, MC32, MC34, and MC35.

[Reset Operation]

Figure 14:
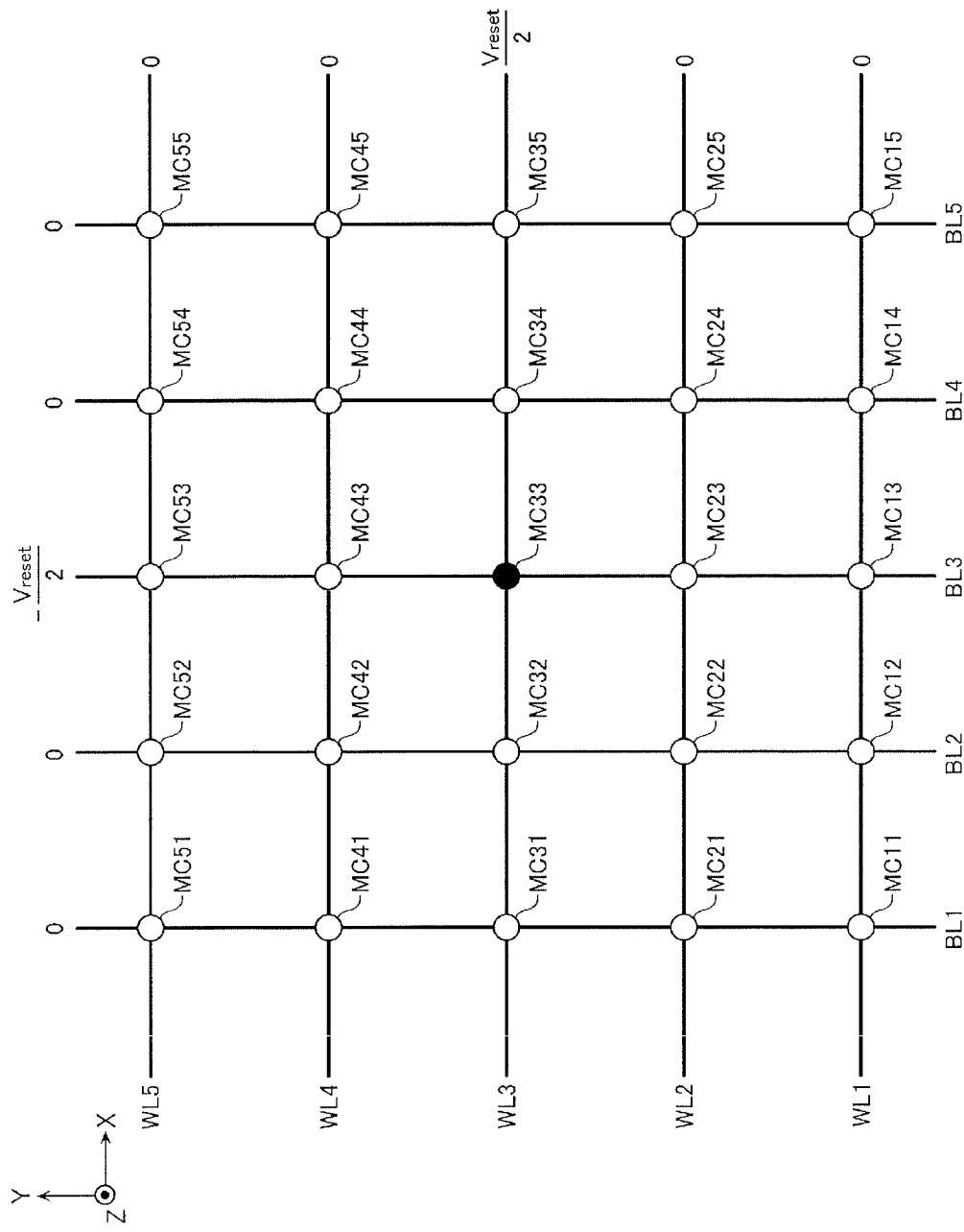
FIG. 14 is a schematic view illustrating voltages supplied to bit lines BL and word lines WL in a reset operation.

FIG. 14 is a schematic view illustrating voltages supplied to bit lines BL and word lines WL in the reset operation.

In the reset operation, for example, a plurality of memory mats MM arranged in the X direction are selected from the plurality of memory mats MM formed on the substrate 100 (see FIG. 5), and the following operation is executed for the plurality of selected memory mats MM. That is, a voltage $-V_{reset}/2$ is transferred to the selected bit line BL3 corresponding to the bit of "0" (or the bit of "1") in the data buffer circuit, and a voltage 0V is transferred to the other selected bit lines BL3. In addition, a voltage 0V is transferred to the unselected bit lines BL1, BL2, BL4, and BL5. In addition, a voltage $V_{reset}/2$ is transferred to the selected word line WL3. In addition, a voltage 0V is transferred to the unselected word lines WL1, WL2, WL4, and WL5.

As illustrated in FIG. 11, a reset pulse (write pulse) having an amplitude $V_{reset}$ and a pulse width $t_{reset}$ is supplied to the selected memory cell MC. The amplitude $V_{reset}$ is larger than the amplitude $V_{set}$. In addition, the pulse width $t_{reset}$ is smaller than the pulse width $t_{set}$. As a result, a current flows in the memory cell MC so that Joule heat is generated, and the chalcogen layer 307 or 407 becomes a molten state. Accordingly, in this state, when the voltages of the selected bit line BL and the selected word line WL are made suddenly lowered, the supply of Joule heat is stopped so that the chalcogen layer 307 or 407 is rapidly cooled, and the molten portion of the chalcogen layer 307 or 407 is solidified into the amorphous state so that the selected memory cell MC33 becomes the reset state.

In addition, in the reset operation, a voltage $V_{reset}/2$ is supplied to the semi-selected memory cells MC13, MC23, MC43, MC53, MC31, MC32, MC34, and MC35. However, since the voltage $V_{reset}/2$ is set to be smaller than the voltage $V_1$ in FIG. 10, a current hardly flows in the semi-selected memory cells MC13, MC23, MC43, MC53, MC31, MC32, MC34, and MC35.

[Access of Controller Chip 33]

Figure 15:
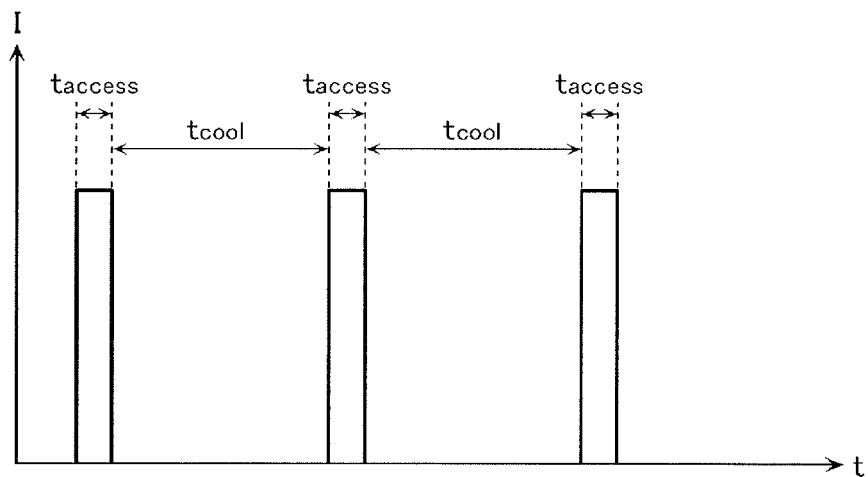
FIG. 15 is a schematic waveform diagram illustrating an operation current of a memory chip.

The read operation and the write operation described above are executed by the memory chip 32 (FIG. 4) in accordance with an access from the controller chip 33 (FIG. 4). Here, when the read operation and the write operation are continuously executed, the temperature of the memory chip 32 may continuously increase. Thus, in the present embodiment, after the memory chip 32 is operated for a predetermined time, a cooling time during which no access is performed to the memory chip 32 for a predetermined time is provided. FIG. 15 is a schematic graph illustrating the operation of the memory chip 32, where the horizontal axis represents time, and the vertical axis represents a current that flows in a pad electrode for supplying a power supply voltage of the memory chip 32 (hereinafter, referred to as "operation current" or the like). In the example of FIG. 15, after the read operation, the write operation and others are executed on the memory chip 32 for a time $t_{access}$, no access is performed to the memory chip 32 during a cooling time $t_{cool}$. In addition, FIG. 15 is a schematic view, and the lengths of the time $t_{access}$ and the cooling time $t_{cool}$ may be appropriately adjusted.

[Change in Characteristics of Nonlinear Element NO]

Figure 16:
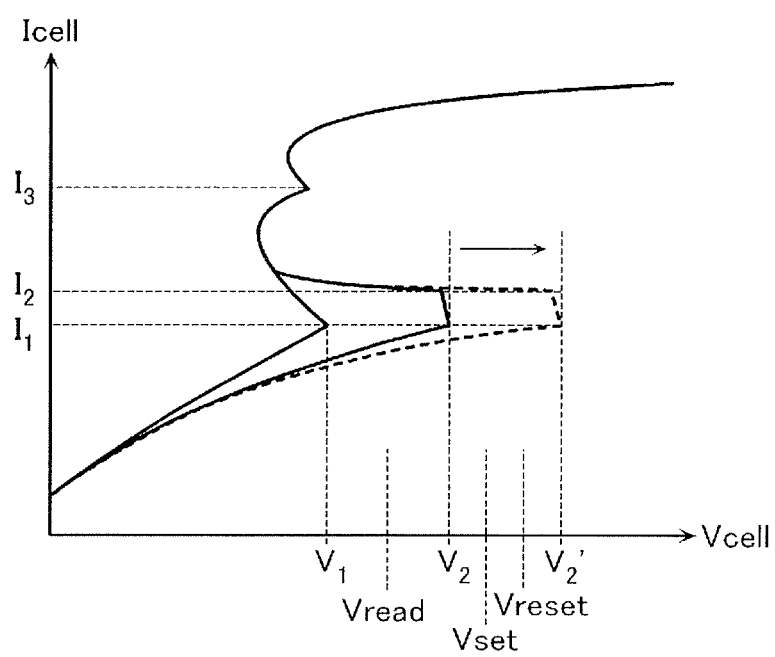
FIG. 16 is a schematic graph illustrating current-voltage characteristics of a memory cell MC of the semiconductor memory device according to the first embodiment.

As described above, in the semiconductor memory device according to the present embodiment, the chalcogen layers 304 and 404 are employed as nonlinear elements NO. Here, the chalcogen layers 304 and 404 have desirable characteristics as nonlinear elements NO. However, when a predetermined time or more elapses while the chalcogen layers 304 and 404 are in the high resistance state, the high resistance may be gradually progressed. In particular, in a case where the high resistance is progressed in the memory cell MC being in the high resistance state, the voltage $V_2$ may increase to a voltage $V_2$ larger than the set voltage $V_{set}$ and the reset voltage $V_{reset}$, to bring the chalcogen layers 304 and 404 into the low resistance state, for example, as illustrated in FIG. 16. Further, in some cases, the voltage $V_2'$ may become larger than the power supply voltage to be supplied to the memory chip 32. This memory cell MC may become difficult to be brought into the set state.

[Refresh Sequence]

When a voltage close to the voltage $V_2'$ is continuously supplied to the memory cell MC including the above-described chalcogen layer 304 or 404 for a long time, the chalcogen layer 304 or 404 may shift to the low resistance state again. In addition, the voltage $V_2'$ of the chalcogen layer 304 or 404 that has once shifted to the low resistance state may fall to about the voltage $V_2$ again.

In addition, the resistance values of the above-described chalcogen layers 307 and 407 decrease with the increase in temperature. Accordingly, by temporarily increasing the temperature of the memory chip 32 so as to reduce the resistance value of the entire memory cell MC, it is possible to bring the above-described memory cell MC into a state where a current easily flows in the memory cell MC.

Accordingly, in the present embodiment, the memory cell MC including the above-described chalcogen layer 304 or 404 is detected, the temperature of the memory chip 32 including the memory cell MC in which a change of characteristics is detected is made increased, and a predetermined voltage is supplied to the memory cell MC including the chalcogen layer 304 or 404. Hereinafter, this operation will be referred to as a "refresh sequence."

Figure 17:
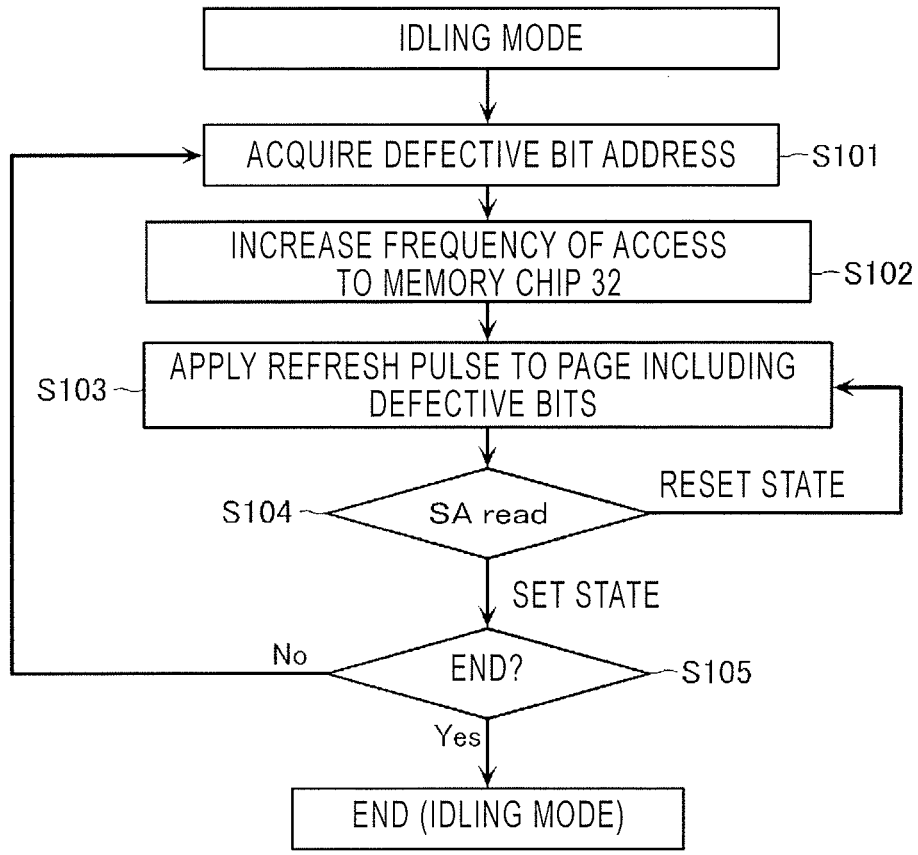
FIG. 17 is a flowchart for illustrating a refresh sequence according to the first embodiment.

Next, the refresh sequence of the semiconductor memory device according to the present embodiment will be described in more detail with reference to FIG. 17. FIG. 17 is a flowchart for illustrating the refresh sequence according to the present embodiment.

As described above, the controller chip 33 is connected to the plurality of memory chips 32 (FIG. 4). The controller chip 33 accesses a memory chip 32 which is not executing the read operation, the write operation and others (hereinafter, referred to as a memory chip 32 in an "idling state" or the like), and executes the refresh sequence.

In step S101, address data of a defective bit stored in the ROM or the like in the controller chip 33 is read out, and the address data of the defective bit and command data for executing the refresh sequence are input as a command set to the memory chip 32. In addition, the defective bit may be acquired by a result from executing a verify operation at the time of the write operation, or by other methods.

Figure 18:
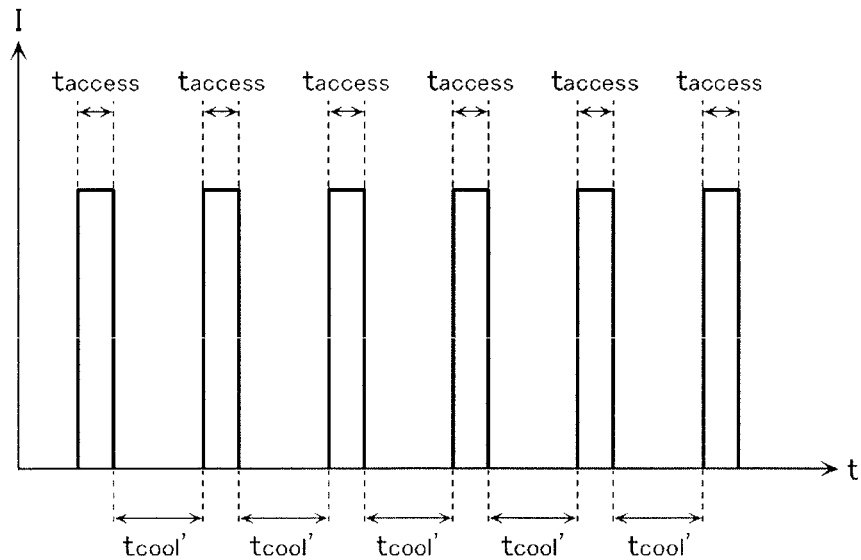
FIG. 18 is a schematic waveform diagram illustrating an operation current of a memory chip.

In step S102, for example, as illustrated in FIG. 18, the frequency of access to the memory chip 32 corresponding to a plurality of selected memory cells MC is made increased, so as to increase the temperature of the memory chip 32. A time $t_{access}$ in FIG. 18 is substantially equal to the time $t_{access}$ in FIG. 15. Meanwhile, a cooling time $t_{cool}'$ in FIG. 18 is shorter than the cooling time $t_{cool}$ in FIG. 15. That is, during the refresh sequence, the access to the memory chip 32 is frequently performed, as compared with a case where an ordinary read or write operation is executed. As a result, the temperature of the memory chip 32 increases. In addition, the cooling time $t_{cool}'$ may be adjusted according to an output signal of a temperature sensor TS provided, for example, on the memory chip 32. In addition, in step S102, an access to a dummy cell, instead of an ordinary memory cell MC, may be performed. The dummy cell is formed, for example, at the end portion of the memory cell array MCA, the peripheral area PA or the like, and has a stacked structure similar to that of a memory cell MC. However, the dummy cell is not used for storing data.

In addition, the process of step S102 is to increase the temperature of the memory chip 32, and a specific method thereof may be appropriately adjusted. For example, in the example of FIG. 18, the temperature of the memory chip 32 is made increased by employing the cooling time $t_{cool}'$ shorter than that in the example of FIG. 15. However, for example, the cooling time may be omitted. In this way, when the temperature of the memory chip 32 is made increased by Joule heat, it is preferable to increase at least an amount of the current flowing in the memory chip 32 per unit time or an average value of the current flowing in the memory chip 32 within a certain time period.

In addition, the process of step S102 may be performed automatically in the memory chip 32, rather than by increasing the frequency of access to the memory chip 32 from the controller chip 33.

In step S103, a refresh pulse supply operation is executed on the plurality of selected memory cells MC.

Figure 19:
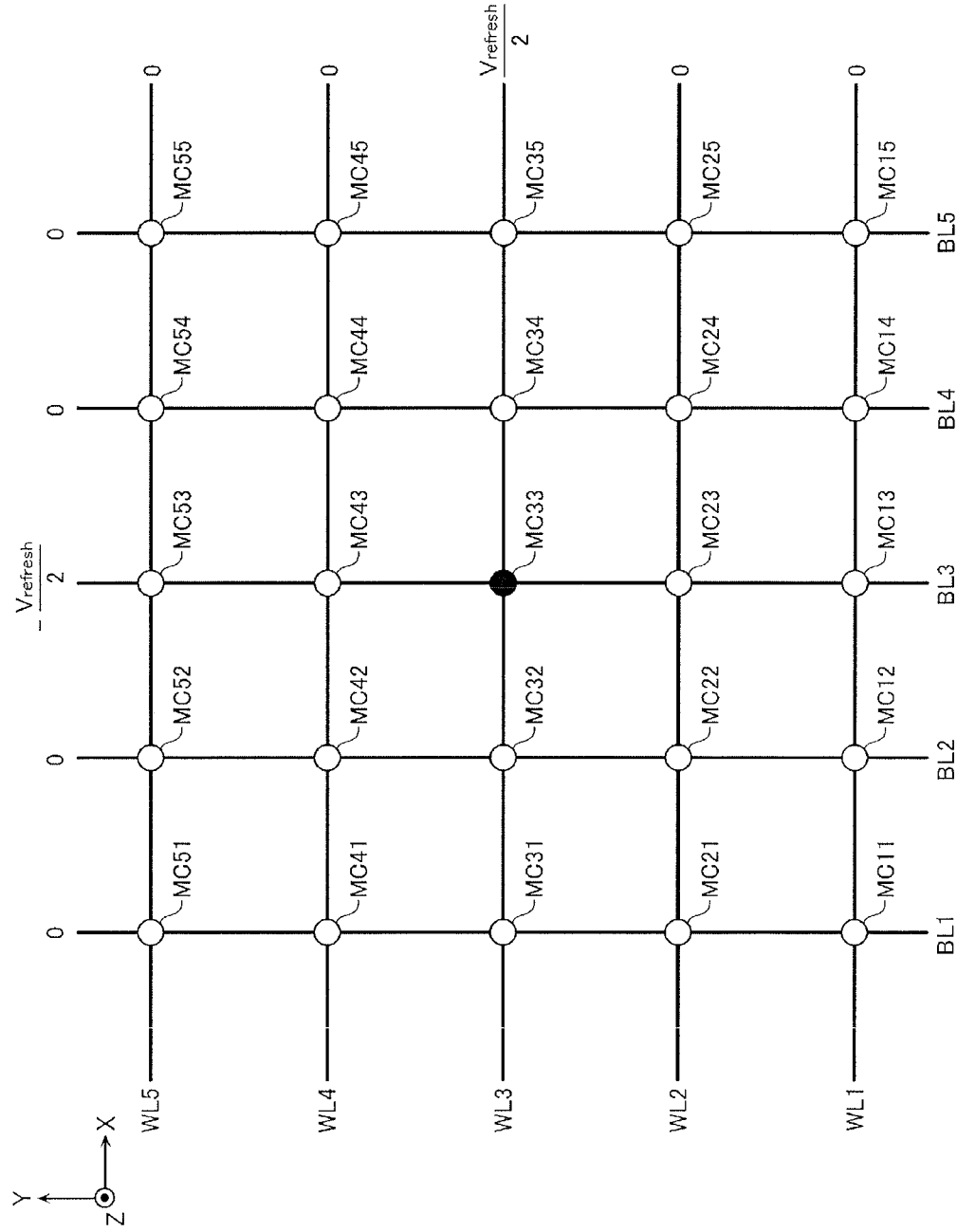
FIG. 19 is a schematic view illustrating voltages supplied to bit lines BL and word lines WL in a refresh pulse supply operation.

In the refresh pulse supply operation, for example, a plurality of memory mats MM corresponding to the plurality of selected memory cells MC are selected from the plurality of memory mats MM formed on the substrate 100 (see FIG. 5), and the following operation is executed for the plurality of memory mats MM. That is, for example, as illustrated in FIG. 19, a voltage $-V_{refresh}/2$ is transferred to a selected bit line BL3 corresponding to the bit of "0" (or the bit of "1") in the data buffer circuit, and a voltage 0V is transferred to the other selected bit lines BL3. In addition, a voltage 0V is transferred to unselected bit lines BL1, BL2, BL4, and BL5. In addition, a voltage $V_{refresh}/2$ is transferred to the selected word line WL3. In addition, a voltage 0V is transmitted to the unselected word lines WL1, WL2, WL4, and WL5.

As illustrated in FIG. 11, a refresh pulse having an amplitude $V_{refresh}$ and a pulse width $t_{refresh}$ is supplied to the selected memory cells MC.

The amplitude $V_{refresh}$ of the refresh pulse may be appropriately adjusted. For example, in the refresh pulse supply operation, a current flows in the memory cells MC by supplying the refresh pulse. To this end, for example, the amplitude $V_{refresh}$ of the refresh pulse may be set to be larger than relatively larger one of the amplitude $V_{set}$ of the set pulse and the amplitude $V_{reset}$ of the reset pulse. Alternatively, it is also conceivable to set the amplitude $V_{refresh}$ of the refresh pulse to be substantially equal to relatively larger one of the amplitude $V_{set}$ of the set pulse and the amplitude $V_{reset}$ of the reset pulse, and further, set the pulse width $y_{refresh}$ of the refresh pulse to be larger than the pulse width $t_{reset}$ of the set pulse. In addition, in the illustrated example, the amplitude $V_{refresh}$ and the amplitude $V_{reset}$ are equal to each other.

In addition, the pulse width $t_{refresh}$ of the refresh pulse may be appropriately adjusted. For example, in the refresh pulse supply operation, a voltage is continuously applied to the memory cells MC which have become the state where a current is difficult to flow as described with reference to FIG. 16, and the flow of current does not occur. To this end, for example, it is conceivable to make the pulse width $t_{refresh}$ of the refresh pulse larger than the pulse width $t_{set}$ of the set pulse. However, when the amplitude $V_{refresh}$ of the refresh pulse is sufficiently large, the temperature of the chalcogen layer 304 or 404 becomes sufficiently high, and thus, it may be understood that ions in the chalcogen layer 304 or 404 are sufficiently diffused even though the pulse width $t_{refresh}$ of the refresh pulse is shorter than the pulse width $t_{set}$ of the set pulse. In addition, in the illustrated example, the pulse width $t_{refresh}$ of the refresh pulse is larger than the pulse width $t_{set}$ of the set pulse.

In step S104, the read operation is executed on the plurality of selected memory cells MC, and it is determined whether the plurality of selected memory cells MC have become the set state. For example, when any one selected memory cell MC in the reset state is detected, the control circuit 18 may determine that the selected memory cells MC have not become the set state. Alternatively, for example, when the number of selected memory cells MC in the reset state is equal to or more than a predetermined number, the control circuit 18 may determine that the selected memory cells MC have not become the set state. When it is determined that the plurality of selected memory cells MC have become the set state, the process proceeds to step S105. When it is determined that the plurality of selected memory cells MC have not become the set state, the process proceeds to step S103.

In step S105, it is determined whether to end the refresh sequence. This determination may be executed according to various conditions. For example, when the refresh sequence is executed for the memory cells MC corresponding to all defective bits, the refresh sequence is ended. When the refresh sequence is not ended, the process proceeds to step S101.

Second Embodiment

Next, a semiconductor memory device according to a second embodiment will be described. In addition, in the following description, the same portions as those in the first embodiment will be denoted by the same reference numerals as used in the first embodiment, and descriptions thereof will be omitted.

Figure 20:
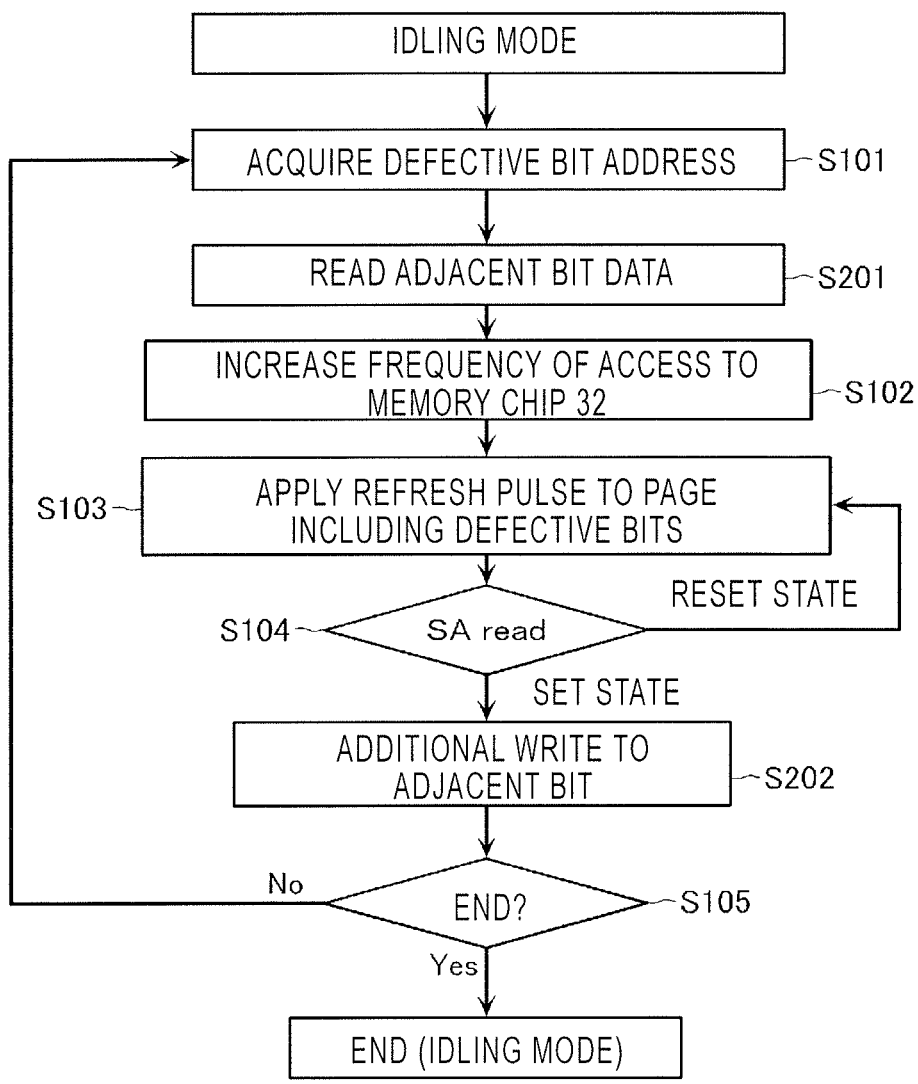
FIG. 20 is a flowchart for illustrating a refresh sequence according to a second embodiment.

FIG. 20 is a flowchart for illustrating a refresh sequence according to the second embodiment.

The refresh sequence according to the present embodiment is basically performed in the same way as that of the refresh sequence according to the first embodiment. However, in the refresh sequence according to the second embodiment, the read operation is executed between steps S101 and S102 on unselected memory cells MC23, MC43, MC32, and MC34 which are adjacent to the selected memory cell MC33 (FIG. 19) (hereinafter, referred to as "adjacent memory cells" or the like) (step S201). The data read in the read operation is temporarily saved in, for example, another memory mat MM or the like. In addition, in the refresh sequence according to the present embodiment, the write operation is executed between steps S104 and S105 on the adjacent memory cells MC23, MC43, MC32, and MC34. The data to be written is the data read out from the adjacent memory cells MC in step S201.

Here, in the refresh sequence, the data of the adjacent memory cells MC23, MC43, MC32, and MC34 may change due to the influence of heat or the like generated in the selected memory cell MC33. According to the present embodiment, it is possible to prevent the influence on the adjacent memory cells MC.

In addition, in the present embodiment, the read operation and the write operation may be executed on all of the four adjacent memory cells MC23, MC43, MC32, and MC34, or may be executed on any one, two or three of the four adjacent memory cells MC23, MC43, MC32, and MC34.

Third Embodiment

Next, a semiconductor memory device according to a third embodiment will be described. In addition, in the following description, the same portions as those in the first embodiment will be denoted by the same reference numerals as used in the first embodiment, and descriptions thereof will be omitted.

Figure 21:
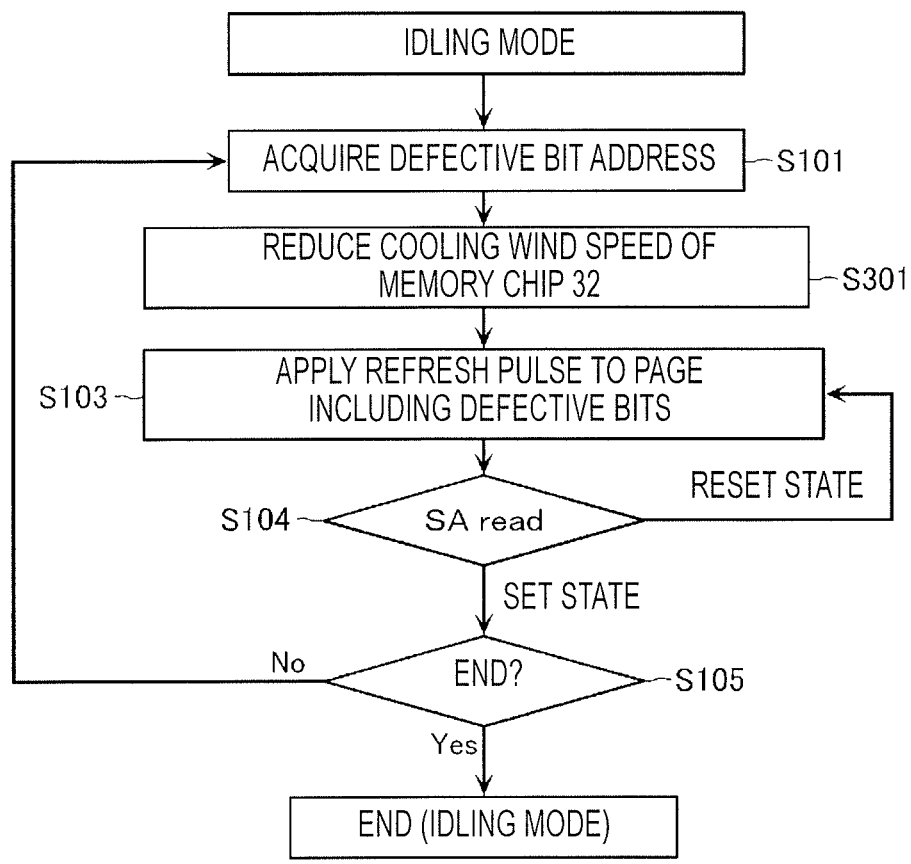
FIG. 21 is a flowchart for illustrating a refresh sequence according to a third embodiment.

FIG. 21 is a flowchart for illustrating a refresh sequence according to the third embodiment.

As described with reference to FIGS. 17 and 18, in the refresh sequence according to the first embodiment, the frequency of access to the memory chips 32 corresponding to the plurality of selected memory cells MC is made increased in step S102, and as a result, the temperature of the memory chip 32 is made increased. However, the method of increasing the temperature of the memory chip 32 may be appropriately modified. For example, in the third embodiment, as illustrated in FIG. 21, a cooling wind speed of the memory chip 32 is reduced in step S301. For example, a rotation speed of a cooling fan for cooling the memory system as illustrated in FIG. 4 is reduced, or the cooling fan is stopped. With this method as well, it is possible to increase the temperature of the memory chip 32.

In addition, in the third embodiment, the processes corresponding to steps S201 and S202 of the second embodiment may also be executed.

OTHER EMBODIMENTS

The semiconductor memory device according to the first to third embodiments has been described. However, the foregoing description is merely an example, and the specific configuration and others may be appropriately modified.

For example, in the first embodiment, as described with reference to FIGS. 12 to 14 and 19, in the read operation, the write operation, and the refresh pulse supply operation, a positive voltage is supplied to the voltage supply line Vp corresponding to the selected word line WL, a negative voltage is supplied to the voltage supply line Vn corresponding to the selected bit line BL, and a voltage 0V is supplied to the voltage supply line VUX corresponding to the unselected word lines WL and the voltage supply line VUB corresponding to the unselected bit lines BL.

Figure 22:
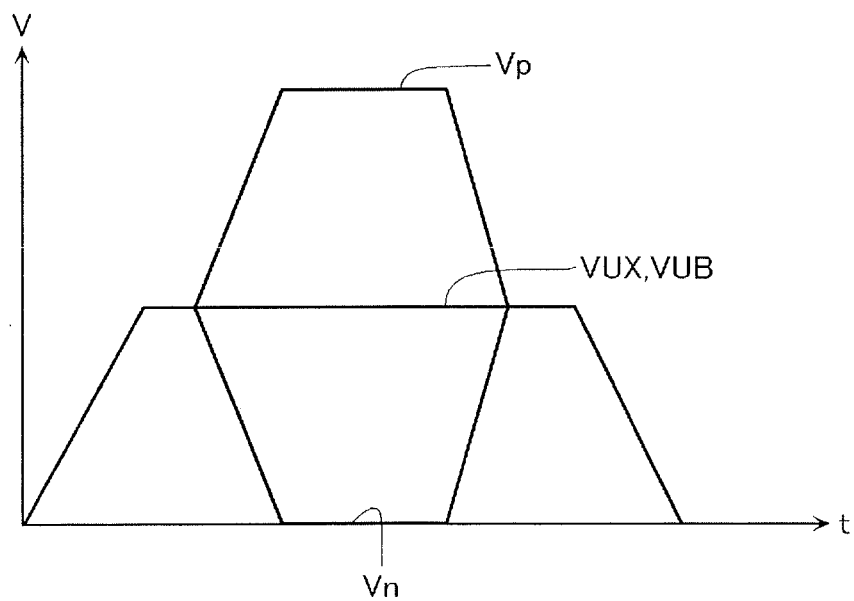
FIG. 22 is a schematic graph illustrating a method of applying a voltage according to a modification.

However, for example, as illustrated in FIG. 22, it is also possible to employ a method that does not use a negative voltage. In this case, in the read operation, the write operation, and the refresh pulse supply operation, for example, as illustrated in FIG. 22, a positive voltage may be supplied to the voltage supply line Vp corresponding to the selected word line WL, a voltage 0V may be supplied to the voltage supply line Vn corresponding to the selected bit line BL, and a voltage which is about half the voltage of the voltage supply line Vp may be supplied to the voltage supply line VUX corresponding to the unselected word lines WL and the voltage supply line VUB corresponding to the unselected bit lines BL.

In addition, the conditions, timings and others for executing the above-described refresh sequence may also be appropriately adjusted. For example, the above-described refresh sequence may be executed when a predetermined or higher bit error rate is detected by the controller chip 33 (FIG. 4) or the like. In addition, the above-described refresh sequence may be executed according to elapse of a predetermined or longer time (e.g., several days, several months, etc.).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of first wirings,
a plurality of second wirings intersecting the plurality of first wirings, and
a plurality of memory cells, each of the plurality of memory cells being respectively formed between one of the plurality of first wirings and one of the plurality of second wirings, and including a variable resistance layer and a nonlinear element layer including chalcogen,
wherein the memory device is configured such that:
in a set operation, a set pulse is supplied between one of the plurality of first wirings and one of the plurality of second wirings,
in a reset operation, a reset pulse is supplied between one of the plurality of first wirings and one of the plurality of second wirings,
in a first operation, a first pulse is supplied between one of the plurality of first wirings and one of the plurality of second wirings, and
the first pulse has an amplitude equal to or greater than the greater of an amplitude of the set pulse and an amplitude of the reset pulse and has a pulse width greater than a pulse width of the set pulse.

2. The semiconductor memory device according to claim 1, further comprising a memory chip that includes the plurality of memory cells,
wherein the memory chip is configured to:
have a first temperature at a first timing when the set operation is started, and
have a second temperature at a second timing when the first operation is started,
wherein the second temperature is greater than the first temperature.

3. The semiconductor memory device according to claim 1, further comprising a memory chip that includes the plurality of memory cells,
wherein the memory device is configured such that, when an average value of a current flowing in the memory chip from a first timing before the set operation is started to a second timing when the set operation is started is defined as a first current,
an average value of a current flowing in the memory chip from, a third timing before the first operation is started to a fourth timing when the first operation is started is defined as a second current, and
a time from the first timing to the second timing is equal to a time from the third timing to the fourth timing,
wherein the second current is greater than the first current.

4. A semiconductor memory device, comprising:
a plurality of first wirings,
a plurality of second wirings intersecting the plurality of first wirings, and
a memory chip including a plurality of memory cells, each of the plurality of memory cells being respectively formed between one of the plurality of first wirings and one of the plurality of second wirings, and including a variable resistance layer and a nonlinear element layer including chalcogen,
wherein the memory device is configured to execute a sequence including a first operation and a second operation on at least one of the plurality of memory cells according to an input of a first command set including address data,
wherein in the first operation, a temperature of the memory chip increases, and
wherein in the second operation, a pulse is supplied between one of the plurality of first wirings and one of the plurality of second wirings that corresponds to the at least one memory cell.

5. The semiconductor memory device according to claim 4, wherein in the sequence,
before the second operation is executed, a read operation has been executed n times, n being a natural number not less than 1 and not more than 4, and
after the second operation is executed, a write operation has been executed n times, n being a natural number not less 1 and not more than 4.

6. The semiconductor memory device according to claim 4, wherein the pulse has an amplitude greater than a greater one of (i) an amplitude of a set pulse, to which to apply on the at least one of the plurality of memory cell in a set operation, and (ii) an amplitude of a reset pulse, to which to apply on the at least one of the plurality of memory cell in a reset operation.

7. The semiconductor memory device according to claim 4, wherein the pulse has an amplitude equal to a greater one of (i) an amplitude of a set pulse, to which to apply on the at least one of the plurality of memory cell in a set operation, and (ii) an amplitude of a reset pulse, to which to apply on the at least one of the plurality of memory cell in a reset operation.

8. A method of operating a memory chip, the memory chip including a plurality of first wirings, a plurality of second wirings, and a plurality of memory cells respectively formed between each of the plurality of first wirings and the plurality of second wirings, the memory cells further including a variable resistance layer and a nonlinear element layer including chalcogen, comprising:
executing a sequence including a first operation and a second operation on at least one of the plurality of memory cells according to an input of a command set including address data,
wherein, in the first operation, a temperature of the memory chip is increased, and
wherein, in the second operation, a pulse is supplied between one of the plurality of first wirings and one of the plurality of second wirings that corresponds to the at least one memory cell.

9. The method of claim 8, wherein the pulse has an amplitude greater than a greater one of (i) an amplitude of a set pulse, to which to apply on the at least one of the plurality of memory cell in a set operation, and (ii) an amplitude of a reset pulse, to which to apply on the at least one of the plurality of memory cell in a reset operation.

10. The method of claim 8, wherein the pulse has an amplitude equal to a greater one of (i) an amplitude of a set pulse, to which to apply on the at least one of the plurality of memory cell in a set operation, and (ii) an amplitude of a reset pulse, to which to apply on the at least one of the plurality of memory cell in a reset operation.

* * * * *